United States Patent
Hanyu et al.

(10) Patent No.: US 11,610,615 B2
(45) Date of Patent: Mar. 21, 2023

(54) LOOKUP TABLE CIRCUIT COMPRISING A PROGRAMMABLE LOGIC DEVICE HAVING A SELECTION CIRCUIT CONNECTED TO A MEMORY CELL ARRAY AND SEPARATED FROM A PATH OF A READ CIRCUIT

(71) Applicant: TOHOKU UNIVERSITY, Miyagi (JP)

(72) Inventors: Takahiro Hanyu, Miyagi (JP); Daisuke Suzuki, Miyagi (JP); Tetsuo Endoh, Miyagi (JP)

(73) Assignee: TOHOKU UNIVERSITY, Miyagi (JP)

( * ) Notice: Subject to any disclaimer, the term of this patent is extended or adjusted under 35 U.S.C. 154(b) by 68 days.

(21) Appl. No.: 17/274,099

(22) PCT Filed: Sep. 7, 2018

(86) PCT No.: PCT/JP2018/033139
§ 371 (c)(1),
(2) Date: Mar. 5, 2021

(87) PCT Pub. No.: WO2020/049708
PCT Pub. Date: Mar. 12, 2020

(65) Prior Publication Data
US 2021/0193206 A1    Jun. 24, 2021

(51) Int. Cl.
*G11C 11/16*    (2006.01)

(52) U.S. Cl.
CPC ...... *G11C 11/1659* (2013.01); *G11C 11/1673* (2013.01)

(58) Field of Classification Search
CPC .................. G11C 11/1659; G11C 11/1673
(Continued)

(56) References Cited

U.S. PATENT DOCUMENTS

| | | | |
|---|---|---|---|
| 6,055,200 A * | 4/2000 | Choi ..................... | G11C 29/50 365/201 |
| 2008/0025070 A1* | 1/2008 | Horii .................. | G11C 13/0069 365/148 |

(Continued)

FOREIGN PATENT DOCUMENTS

| | | |
|---|---|---|
| JP | 2004-88597 A | 3/2004 |
| JP | 2008-112508 A | 5/2008 |
| JP | 2010-81172 A | 4/2010 |

OTHER PUBLICATIONS

R. Zand et al.: "Energy-Efficient Nonvolatile Reconfigurable Logic using Spin Hall Effect-based Lookup Tables," IEEE Transactions on Nanotechnology, vol. 16, No. 1, pp. 32-43, Jan. 2017.

(Continued)

*Primary Examiner* — Connie C Yoha
(74) *Attorney, Agent, or Firm* — Fox Rothschild LLP; Robert J. Sacco; Carol E. Thorstad-Forsyth

(57) ABSTRACT

A lookup table circuit constituting a programmable logic device includes: a memory cell array including a plurality of memory cells, each having a resistive memory element; a selection circuit connected to the memory cell array and configured to output, to the memory cell array, a single cell-select signal or two or more cell-select signals for selecting a single memory cell or two or more memory cells among the plurality of memory cells, based on input of a plurality of logic signals; and a read circuit connected to the memory cell array and configured to read data from the single memory cell or the two or more memory cells selected by the single cell-select signal or the two or more cell-select signals, among the plurality of memory cells. The selection circuit is separated from a path along which the read circuit is configured to read data from the memory cell array.

10 Claims, 22 Drawing Sheets

(58) Field of Classification Search
USPC .......................................................... 365/158
See application file for complete search history.

(56) References Cited

U.S. PATENT DOCUMENTS

2011/0228586 A1* 9/2011 Kawabata ............ G11C 13/004
365/148
2015/0228334 A1* 8/2015 Nazarian ............ G11C 13/0069
365/72

OTHER PUBLICATIONS

A. Attaran et al.: "Dynamic single and Dual Rail spin transfer torque look up tables with enhanced robustness under CMOS and MTJ process variations," 2016 IEEE 34th International Conference on Computer Design (ICCD), pp. 348-351, Oct. 2016.

* cited by examiner

FIG. 13    1st MODE

LOOKUP TABLE CIRCUIT COMPRISING A PROGRAMMABLE LOGIC DEVICE HAVING A SELECTION CIRCUIT CONNECTED TO A MEMORY CELL ARRAY AND SEPARATED FROM A PATH OF A READ CIRCUIT

CROSS REFERENCE TO RELATED APPLICATIONS

This application is a § 371 U.S. National Phase Entry of International Patent Application No. PCT/JP2018/033139, filed on Sep. 7, 2018, the entirety of which is hereby incorporated herein by reference.

TECHNICAL FIELD

The present invention relates to a lookup table circuit constituting a programmable logic device.

BACKGROUND ART

As a programmable logic device, a field-programmable gate array (FPGA) is known which includes a programmable gate array to make any arbitrary functions, for example. A nonvolatile FPGA employs a configuration of a logic device using a resistive memory element, for example (see Non-Patent Literature 1 and Non-Patent Literature 2, for example), which allows the stored data to remain without a power supply, thereby eliminating wasted standby power consumption.

A logic cell of the FPGA includes a lookup table (LUT). FIG. 1 shows a configuration of a fracturable lookup table circuit 1A as an example of a conventional lookup table circuit (see Non-Patent Literature 1). The lookup table circuit 1A is a 6-input lookup table circuit, and includes a memory cell array 10 having memory cells MC_0 to MC_63, a selection circuit 4a connected to the memory cell array 10, a mode selector 2a that is connected to the selection circuit 4a and switches between modes (functions) in response to input of a control signal SEL, and a read circuit 3 that is connected to the mode selector 2a and has sense amplifiers (SAs) 3a and 3b.

The selection circuit 4a is a circuit for selecting at least one memory cell from the memory cells MC_0 to MC_63 based on input of 6-bit logic signals, and includes a multiplexer tree having six series-connected NMOS transistors. The mode selector 2a includes a transistor that is turned on and off in response to the input of the control signal SEL to switch the electrical connection between the sense amplifiers 3a and 3b and the selection circuit 4a.

CITATION LIST

Non-Patent Literature

Non-Patent Literature 1: R. Zand, A. Roohi, D. Fan and R. F. DeMara, "Energy-Efficient Nonvolatile Reconfigurable Logic using Spin Hall Effect-based Lookup Tables," IEEE Transactions on Nanotechnology, Vol. 16, No. 1, pp. 32-43, January 2017.

Non-Patent Literature 2: A. Attaran, H. Salmani, H. Homayoun and H. Mahmoodi, "Dynamic single and Dual Rail spin transfer torque look up tables with enhanced robustness under CMOS and MTJ process variations," 2016 IEEE 34th International Conference on Computer Design (ICCD), pp. 348-351, October 2016.

SUMMARY OF INVENTION

Technical Problem

In the conventional lookup table circuit 1A shown in FIG. 1, the selection circuit 4a is provided between the memory cell array 10 and the read circuit 3. With this structure, when the read circuit 3 reads data from the memory cell array 10 (read enable signal RE=1), it is necessary to pass through multiple series-connected transistors in the selection circuit 4a, which results in a small read margin due to voltage drop. Moreover, since the mode selector 2a for mode switching is also provided on a read-current path, it is also necessary to pass through the transistor of the mode selector 2a when reading data from the memory cell array 10, which results in an even smaller read margin, leading to a decrease in read speed.

In order to improve the read margin, the number of series-connected transistors in the selection circuit need to be reduced. An example of such a circuit is shown in FIG. 2. A lookup table circuit 1B in FIG. 2 is a fracturable 6-input lookup table circuit, and includes a mode selector 2b and four LUTs. The mode selector 2b switches between modes in response to input of 2-bit logic signals and input of a control signal SEL. Each of the four LUTs includes memory cells MC_0 to MC_15, a sense amplifier 3c, and a selection circuit 4b connected between the memory cells MC_0 to MC_15 and the sense amplifier 3c. The selection circuit 4b includes a multiplexer tree having four series-connected NMOS transistors, and selects one memory cell from the memory cells MC_0 to MC_15 in response to input of 4-bit logic signals.

Thus, a multi-input lookup table circuit can be provided by combining a plurality of LUTs with a smaller number of logic signal inputs. Since the lookup table circuit 1B shown in FIG. 2 has a smaller number of the series-connected transistors in the selection circuit 4b on the read-current path than the selection circuit 4 of the lookup table circuit 1A shown in FIG. 1, it is possible to improve the read margin. On the other hand, the lookup table circuit 1B needs to include a peripheral circuit such as the sense amplifier 3c for each LUT, which results in a large circuit area.

The invention has been made in view of the foregoing, and an object of the invention is to enhance a read margin in a lookup table circuit.

Solution to Problem

A lookup table circuit constituting a programmable logic device according to one embodiment of the invention includes: a memory cell array including a plurality of memory cells, each having a resistive memory element; a selection circuit connected to the memory cell array and configured to output, to the memory cell array, a single cell-select signal or two or more cell-select signals for selecting a single memory cell or two or more memory cells among the plurality of memory cells, based on input of a plurality of logic signals; and a read circuit connected to the memory cell array and configured to read data from the single memory cell or the two or more memory cells selected by the single cell-select signal or the two or more cell-select signals, among the plurality of memory cells. The selection circuit is separated from a path along which the read circuit is configured to read data from the memory cell array.

Advantageous Effects of Invention

According to the lookup table circuit of the invention, since the selection circuit for selecting the memory cell is separated from a path for reading data, the read margin can be enhanced.

DESCRIPTION OF EMBODIMENTS

Hereinafter, embodiments of the invention will be described with reference to the drawings.

The same reference signs are used to designate the same or similar elements throughout the drawings.

First Embodiment

A lookup table circuit according to a first embodiment of the invention will be described with reference to FIGS. 3 to 9.

Figure 3:
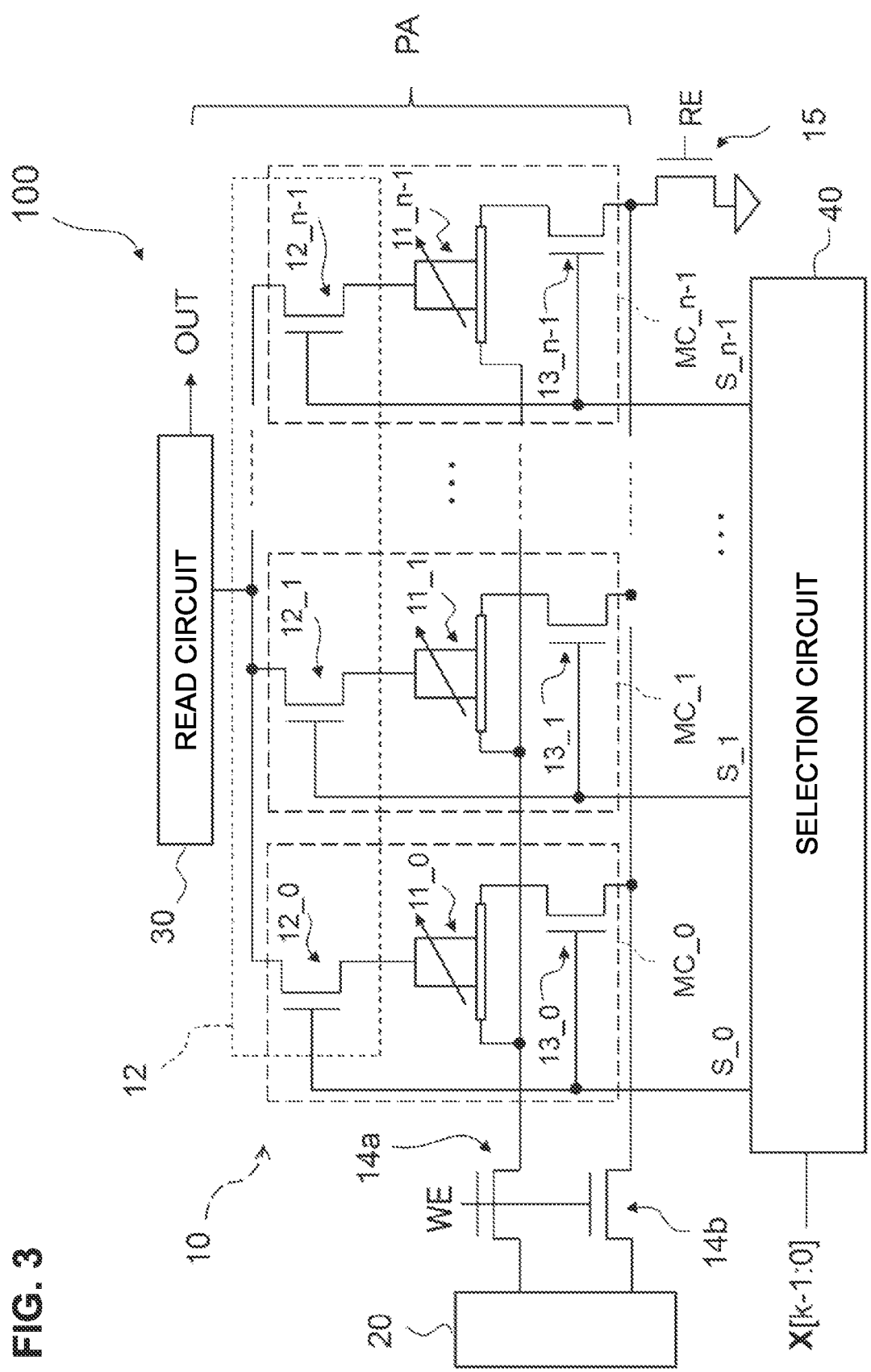
FIG. 3 is a schematic diagram illustrating a configuration of a lookup table circuit according to a first embodiment of the invention.

FIG. 3 shows a configuration of a nonvolatile lookup table circuit 100 according to the first embodiment. The lookup table circuit 100 forms a basic configuration block of a field-programmable gate array (FPGA) that is a programmable logic device, and includes a memory cell array 10, a write circuit 20, a read circuit 30, and a selection circuit 40. The memory cell array 10 is connected to the selection circuit 40, the write circuit 20, and the read circuit 30. As shown in FIG. 3, the selection circuit 40 is separated from a path (read-current path) PA along which the read circuit 30 reads data from the memory cell array 10.

Figure 4A:
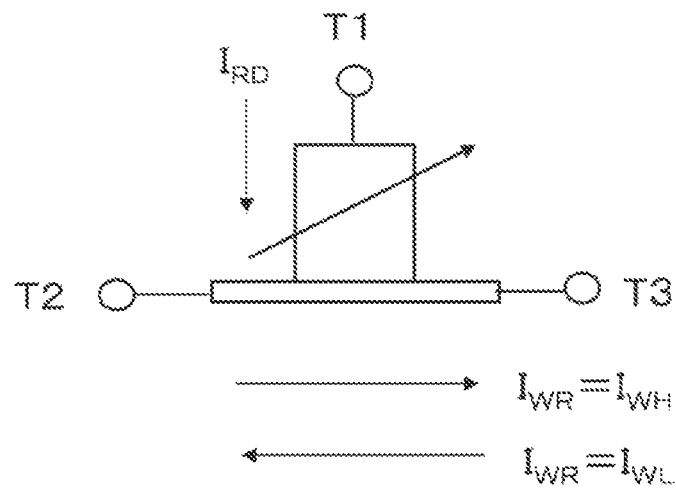
FIG. 4A is a schematic diagram illustrating a resistance value of a 3-terminal magnetic tunnel junction device.

The memory cell array 10 includes memory cells MC_0 to MC_n−1 (n=$2^k$, k is a positive integer) connected in parallel. Each memory cell MC_i (i=0, 1, . . . , n−1) includes a magnetic tunnel junction device (MTJ device) 11_i as a resistive memory element, an NMOS access transistor 12_i that controls access to the MTJ device 11_i from the read circuit 30, and an NMOS transistor 13_i for write control. The MTJ device 11_i is a 3-terminal MTJ device having one read terminal T1 and two write terminals T2 and T3 as shown in FIG. 4A. The read terminal T1 is connected to the access transistor 12_i. The write terminal T2 is connected to one of two write lines extending from the write circuit 20, and the write terminal T3 is connected to the other one of the two write lines through the transistor 13_i.

When a write current $I_{WR}$ (high resistance current $I_{WH}$) flows from the write terminal T2 to the write terminal T3, the MTJ device 11_i shows a high resistance $R_H$. Conversely, when a write current $I_{WR}$ (low resistance current $I_{WL}$) flows from the write terminal T3 to the write terminal T2, the MTJ device 11_i shows a low resistance $R_L$. For example, assuming that the high resistance $R_H$ represents data "1" (M=1) and the low resistance $R_L$ represents data "0" (M=0), data (0 or 1) corresponding to the flow direction of the write current $I_{WH}$ is written in the MTJ device 11_i. When a read current $I_{RD}$ flows through the read terminal T1 (for example, flows from the terminal T3), a voltage drop corresponding to the resistance value (low resistance $R_L$, high resistance $R_H$) of the MTJ device 11_i occurs. By detecting this voltage drop, the data (0 or 1) written in the MTJ device 11_i is read by the read circuit 30.

Figure 4B:
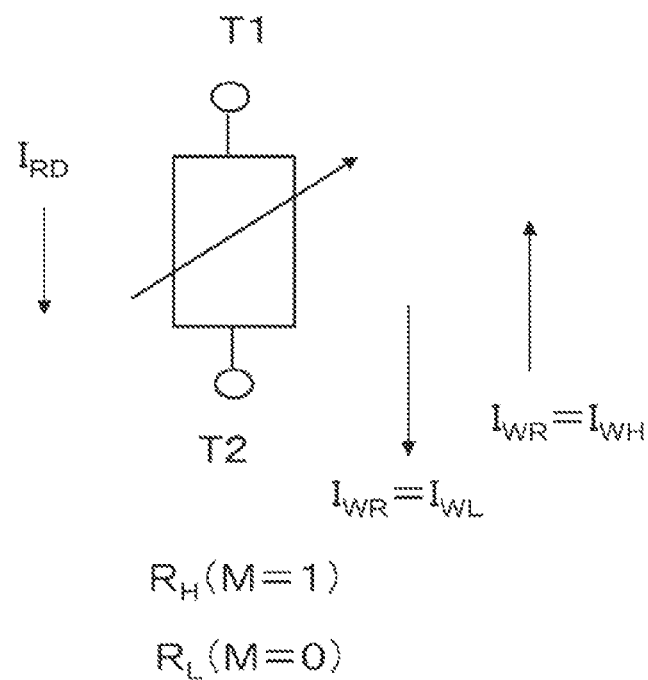
FIG. 4B is a schematic diagram illustrating a resistance value of a 2-terminal magnetic tunnel junction device.

Instead of the 3-terminal MTJ device shown in FIG. 4A, a 2-terminal MTJ device shown in FIG. 4B may be employed. The 2-terminal MTJ device includes two terminals T1 and T2. When the write current $I_{WR}$ (low resistance current $I_{WL}$) flows from the terminal T1 to the terminal T2, the MTJ device shows a low resistance $R_L$. Conversely, when the write current $I_{WR}$ (high resistance current $I_{WH}$) flows from the terminal T2 to the terminal T1, the MTJ device shows a high resistance $R_H$. Therefore, data (0 or 1) corresponding to the resistance value (low resistance $R_L$, high resistance $R_H$) is written in the MTJ device. When the read current $I_{RD}$ flows from the terminal T1, a voltage drop corresponding to the resistance value (low resistance $R_L$, high resistance $R_H$) of the MTJ device occurs. By detecting the voltage drop, the data (0 or 1) written in the MTJ device can be read.

The access transistor 12_i is connected between the read terminal T1 of the MTJ device 11_i and a read connection terminal UE (FIG. 6) of the read circuit 30. The access transistors 12_0 to 12_n−1 constitute an access transistor array 12. The transistor 13_i is connected to the write terminal T3 of the MTJ device 11_i and the other one of the above-described two write lines. Selection signal lines extend from the selection circuit 40 toward the memory cells MC_0 to MC_n−1, respectively, and each selection signal line is connected to a gate of the access transistor 12_i and a gate of the transistor 13_i in the corresponding memory cell MC_i.

NMOS transistors 14a and 14b for write control are provided on the two write lines extending from the write circuit 20. A write enable signal WE is input to each gate of the transistors 14a and 14b. Each of the transistors 14a and 14b is turned on in response to the write enable signal WE, allowing the write current $I_{WR}$ to flow through each write line. This allows the write circuit 20 to write data to the MTJ device 11_i.

The write line on which the transistor 14b is provided, extending from the write circuit 20, is used as a current line at the time of reading data, and a transistor 15 for read control is connected between the current line and the ground terminal. A read enable signal RE is input to a gate of the transistor 15. The transistor 15 is turned on in response to the input of the read enable signal RE to set the current line to which each transistor 13_i is connected, to the ground level. This allows the read current $I_{RD}$ output from the read circuit 30 to flow through the access transistor 12_i, the MTJ device 11_i, and the transistor 13_i, which makes it possible to read data from the MTJ device 11_i.

The selection circuit 40 outputs a cell-select signal S_i through a selection signal line corresponding to the memory cell MC_i to be enabled, based on the input of logic signals. The cell-select signal S_i output from the selection circuit 40 turns on the corresponding access transistor 12_i and transistor 13_i, allowing the write circuit 20 to write data to the MTJ device 11_i and allowing the read circuit 30 to read data from the MTJ device 11_i. The specific configuration of the selection circuit 40 will be described later.

Figure 5:
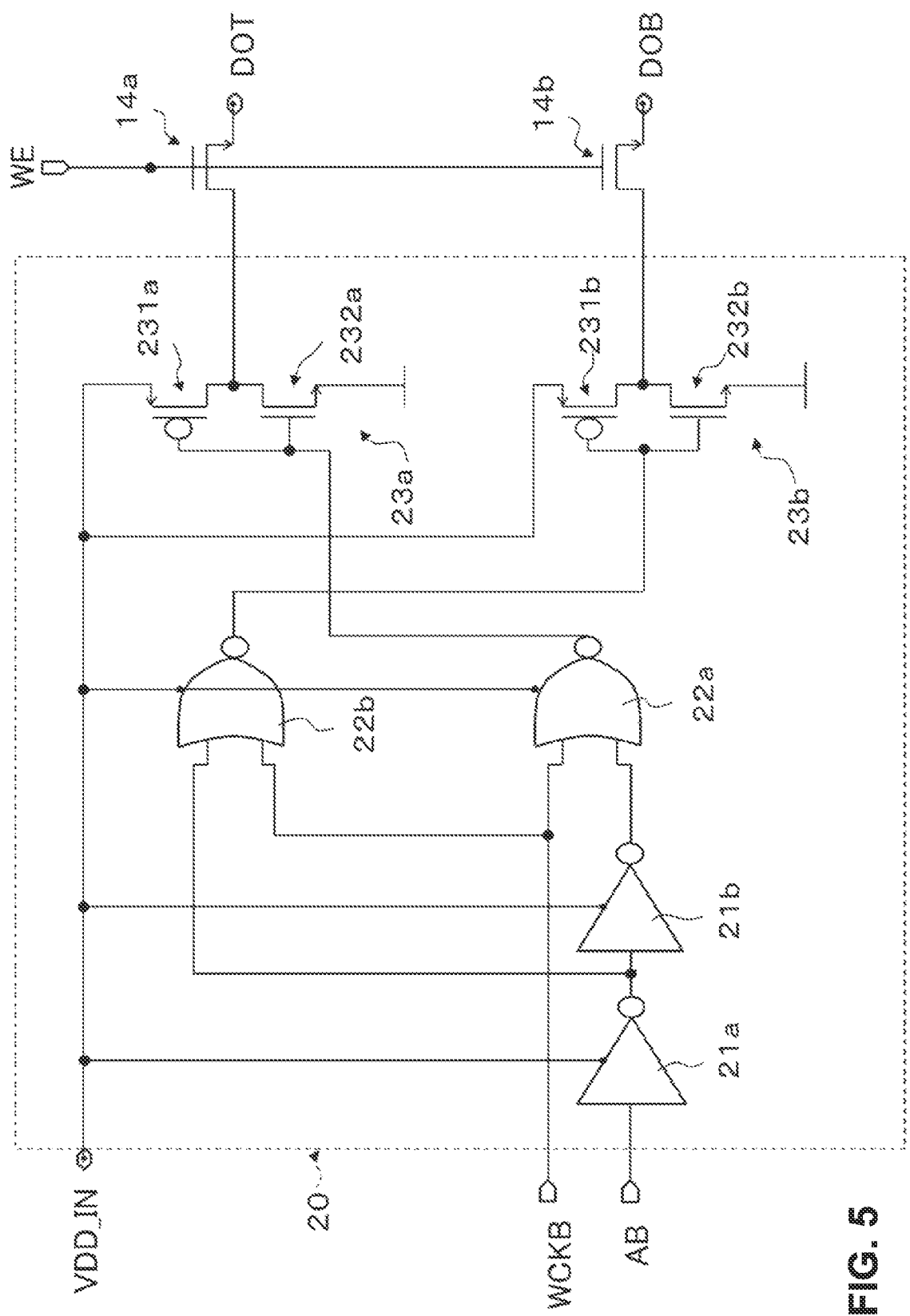
FIG. 5 is a diagram illustrating a configuration of a write circuit shown in FIG. 3.

As shown in FIG. 5, the write circuit 20 includes a first current supply circuit 23a, a second current supply circuit 23b, NOT gates 21a and 21b, and NOR gates 22a and 22b. In the first current supply circuit 23a, a PMOS transistor 231a and an NMOS transistor 232a are connected in series between a power input terminal VDD_IN and the ground. Similarly, in the second current supply circuit 23b, a PMOS transistor 231b and an NMOS transistor 232b are connected in series between the power input terminal VDD_IN and the ground.

The write line on which the transistor 14a is provided extends from a connection point between the transistor 231a and the transistor 232a in the first current supply circuit 23a through a terminal DOT. The write line on which the transistor 14b is provided extends from a connection point between the transistor 231b and the transistor 232b in the second current supply circuit 23b through a terminal DOB.

The NOR gates 22a and 22b are active as NOT gates when a signal WCKB is "0". In this state, when data "1" (H level) is input to an input terminal AB, the H level signal passing through the NOT gates 21a and 21b is further inverted by the NOR gate 22a to become an L level signal, and the L level signal is input to a gate of the transistor 231a and a gate of the transistor 232a. At this time, an L level signal obtained through the NOT gate 21a is inverted by the NOR gate 22b to become an H level signal, and the H level signal is input to a gate of the transistor 231b and a gate of the transistor 232b.

Therefore, in the first current supply circuit 23a, the PMOS transistor 231a is turned on and the NMOS transistor 232a is turned off, and in the second current supply circuit 23b, the PMOS transistor 231b is turned off and the NMOS transistor 232b is turned on. As a result, the write current $I_{WR}$ output from the first current supply circuit 23a flows through the write line on which the transistor 14a is provided via the terminal DOT, and flows into the second current supply circuit 23b via the terminal DOB. As a result, data "1" is written to the memory cell MC_i selected by the cell-select signal S_i.

On the other hand, when data "0" (L level) is input to the input terminal AB, the L level signal passing through the NOT gates 21a and 21b is further inverted by the NOR gate 22a to become an H level signal, and the H level signal is input to the gate of the transistor 231a and the gate of the transistor 232a. At this time, an H level signal obtained through the NOT gate 21a is inverted by the NOR gate 22b to become an L level signal, and the L level signal is input to the gate of the transistor 231b and the gate of the transistor 232b.

Therefore, in the first current supply circuit 23a, the PMOS transistor 231a is turned off and the NMOS transistor 232a is turned on, and in the second current supply circuit 23b, the PMOS transistor 231b is turned on and the NMOS transistor 232b is turned off. As a result, the write current $I_{WR}$ output from the second current supply circuit 23b flows through the write line on which the transistor 14b is provided via the terminal DOB, and flows into the first current supply circuit 23a via the terminal DOT. As a result, data "0" is written to the memory cell MC_i selected by the cell-select signal S_i.

Figure 6:
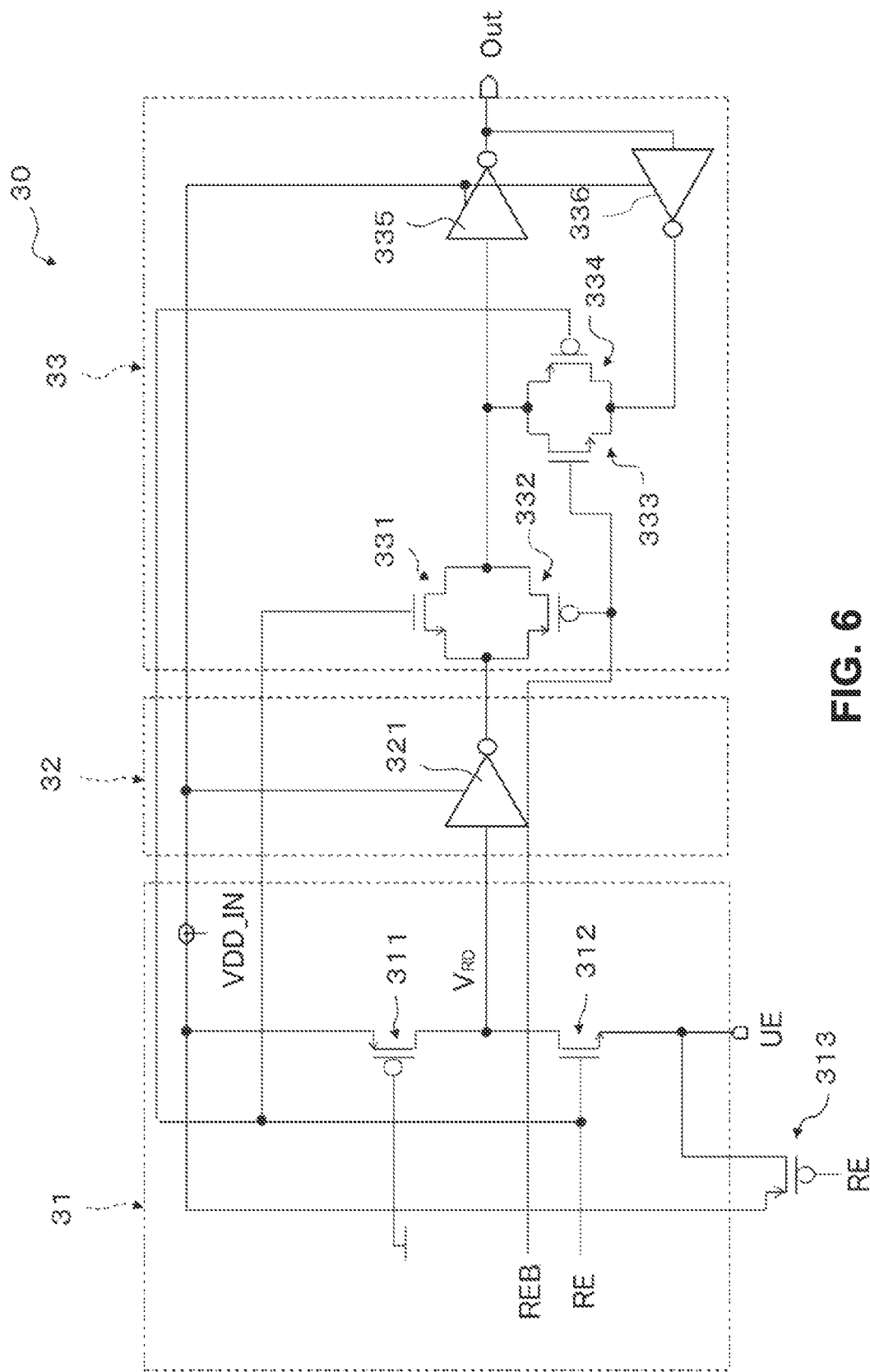
FIG. 6 is a diagram illustrating a configuration of a read circuit shown in FIG. 3.

The read circuit 30 is a single-ended sense amplifier, and includes a resistance dividing part 31, an inverting part 32, and a latch part 33, as shown in FIG. 6. The single-ended sense amplifier is a sense amplifier that directly reads a read signal (voltage/current) as an input signal from the MTJ device.

In the resistance dividing part 31, a PMOS transistor 311 and an NMOS transistor 312 are connected in series between the power input terminal VDD_IN and the read connection terminal UE. The transistor 311 has a gate connected to the ground and is always ON, and thus functions as a load resistor. The read enable signal RE is input to a gate of the transistor 312, and the transistor 312 is turned on and off in response to the input of the read enable signal RE.

The read connection terminal UE is connected to the read terminal T1 of the MTJ device 11_i through the access transistor 12_i. With this structure, when the transistor 312 is turned on, the read current $I_{RD}$ flows from the power input terminal VDD_IN to the corresponding MTJ device 11_i through the transistor 311, the transistor 312, and the access transistor 12_i turned on by the cell-select signal S_i. As a result, a power supply voltage VDD is divided by the resistance (low resistance, high resistance) corresponding to the data (0 or 1) written in the MTJ device 11_i and the load resistance of the transistor 311, and the divided voltage (hereinafter, referred to as a "read voltage") appears at the connection point between the transistor 311 and the transistor 312. Since the load resistance of the transistor 311 is constant, the read voltage $V_{RD}$ (divided voltage) corresponds to the data (high resistance, low resistance) written in the MTJ device 11_i.

The inverting part 32 includes an inverting circuit 321. The read voltage $V_{RD}$ corresponding to the data (0: low resistance, 1: high resistance) written in the MTJ device 11_i is input from the resistance dividing part 31 to the inverting circuit 321. The read voltage $V_{RD}$ is inverted and amplified by the inverting circuit 321, and the resulting voltage is fed to the latch part 33.

The latch part 33 includes a first circuit having an NMOS transistor 331 and a PMOS transistor 332, a NOT gate 335 connected in series to the first circuit, a NOT gate 336, and a second circuit having an NMOS transistor 333 and a PMOS transistor 334. As shown in FIG. 6, in the latch part 33, the output of the NOT gate 335 is returned to the input of the NOT gate 335 through the NOT gate 336 and the second circuit. The read enable signal RE is input to the gate of the NMOS transistor 331 and the gate of the PMOS transistor 334, and a read enable signal REB (inverted signal of the RE) is input to the gate of the PMOS transistor 332 and the gate of the NMOS transistor 333.

When the read enable signal RE is 1 and the read enable signal REB is 0, the read voltage $V_{RD}$, which corresponds to the resistance value (low resistance, high resistance) of the MTJ device 11_i that is the data (0, 1) written in the MTJ device 11_i, appears at the connection point between the transistor 311 and the transistor 312 of the resistance dividing part 31, and the read voltage $V_{RD}$ is inverted and amplified by the inverting circuit 321. When the read enable signal RE is 0 and the read enable signal REB is 1, the output voltage of the inverting circuit 321 is held in the latch part 33, and the held voltage of the level (L, H) corresponding to the data (0, 1) written in the MTJ device 11_i is output from an output terminal Out.

Non-Patent Literature 1 and Non-Patent Literature 2 disclose a read circuit using a differential sense amplifier that reads data by comparing a read signal from an MTJ device with a constant signal obtained by a reference circuit. In contrast, the read circuit 30 of the first embodiment is a single-ended sense amplifier that directly amplifies the voltage corresponding to the data read from the MTJ device 11_i without using a reference circuit. Thus, the lookup table circuit 100 of the first embodiment does not require a reference circuit unlike Non-Patent Literature 1 and Non-Patent Literature 2, which makes it possible to suppress the circuit area. Moreover, since the selection circuit 40 is separated from the read-current path PA, data can be read from the memory cell array 10 without passing through the selection circuit 40. Therefore, even if the difference (resistance difference) between the high resistance and the low resistance corresponding to the data written in the MTJ device 11_i is small, the voltage required for reading by the single-ended sense amplifier can be easily obtained. Hence, the configuration in which the selection circuit 40 is separated from the read-current path PA is particularly effective in enhancement of the read margin of the single-ended sense amplifier.

As shown in FIG. 6, between the power input terminal VDD_IN and the read connection terminal UE, a PMOS pre-charge transistor 313 (charging circuit) is connected in parallel with the series circuit of the transistors 311 and 312. The read enable signal RE is input to a gate of the pre-charge transistor 313. When the read enable signal RE is at an L level (RE=0), the pre-charge transistor 313 is turned on to maintain the read connection terminal UE at an H level (power supply voltage VDD). Therefore, during the read operation is not performed (RE=0), each access transistor 12_i of the access transistor array 12 connected to the read connection terminal UE is pre-charged (charged). This makes it possible to improve processing speed in reading data from the MTJ device 11_i through each access transistor 12_i (RE=1).

Next, reference will be made to a configuration of the selection circuit 40.

Figure 7:
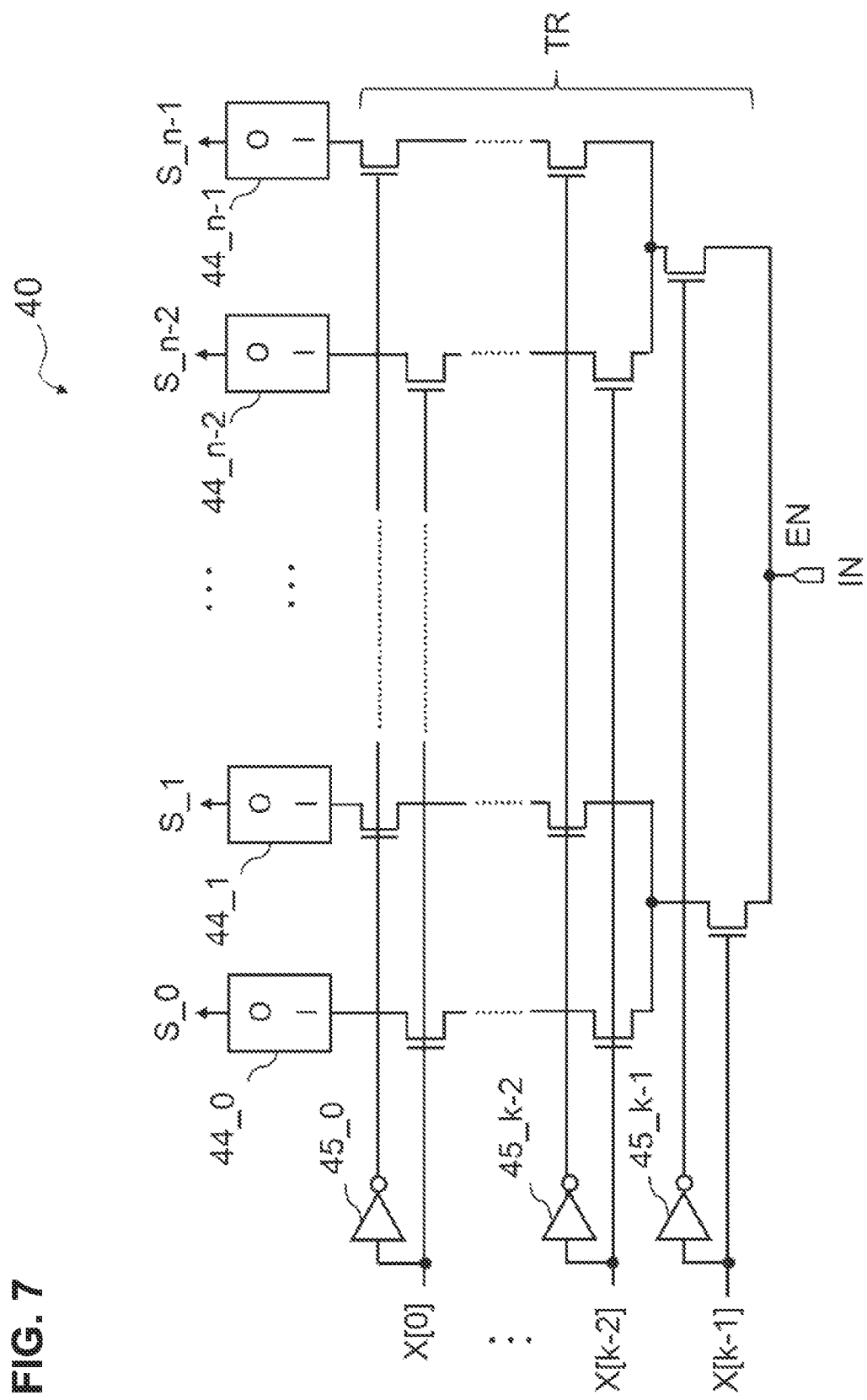
FIG. 7 is a diagram illustrating a configuration of a selection circuit according to the first embodiment shown in FIG. 3.

The selection circuit 40 is a circuit for selecting the memory cell MC_i based on the input of k-bit logic signals (input of k logic signals; $2^k=n$). Specifically, as shown in FIG. 7, the selection circuit 40 includes NMOS transistors TR connected in a tree structure with k levels, inverting circuits 45_0 to 45_k−1, and output circuits 44_0 to 44_n−1 corresponding to the memory cells MC_0 to MC_n−1, respectively. The selection circuit 40 constitutes a k-input multiplexer tree (k-input MUX tree).

Figure 8:
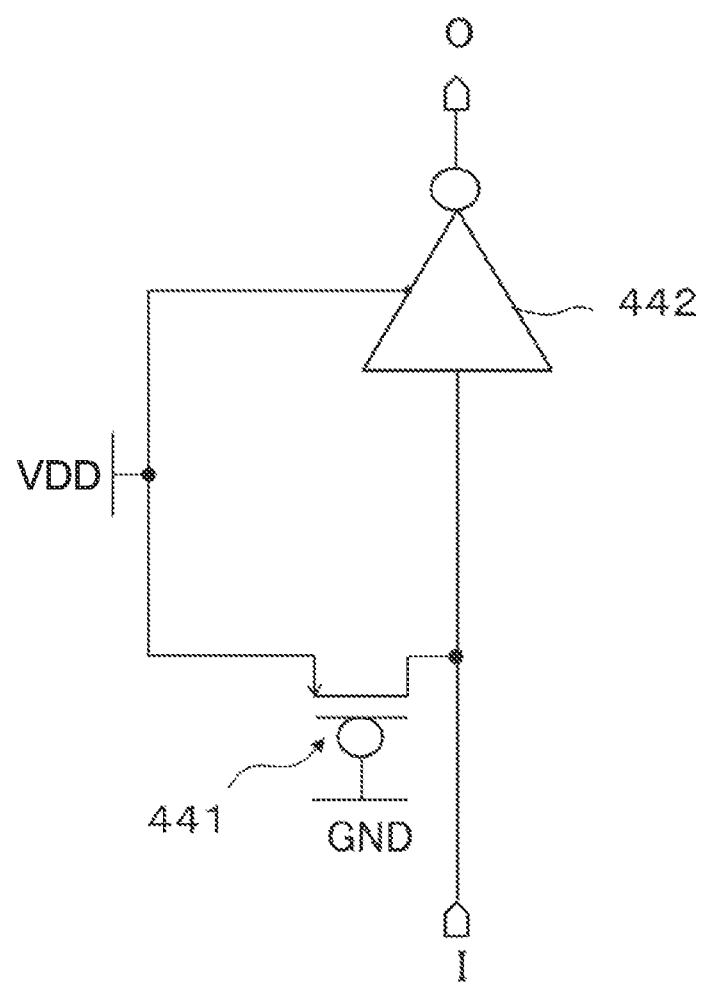
FIG. 8 is a diagram illustrating a configuration of an output circuit of the selection circuit.

Each of the output circuits 44_0 to 44_n−1 includes a PMOS transistor 441 and an inverting circuit 442, as shown in FIG. 8. The input of the inverting circuit 442 is connected to an input terminal I, and the output of the inverting circuit 442 is connected to an output terminal O. The transistor 441 is connected between the input of the inverting circuit 442 and the input terminal I and the power supply. A gate of the transistor 441 is connected to the ground GND, and thus the transistor 441 is always ON. Therefore, the output of the inverting circuit 442, i.e., the output terminal O is normally maintained at the L level by the power supply voltage VDD.

Input ports X[0] to X[k−1] or outputs of the inverting circuits 45_0 to 45_k−1 are connected to gates of the transistors TR of the selection circuit 40.

Figure 9:
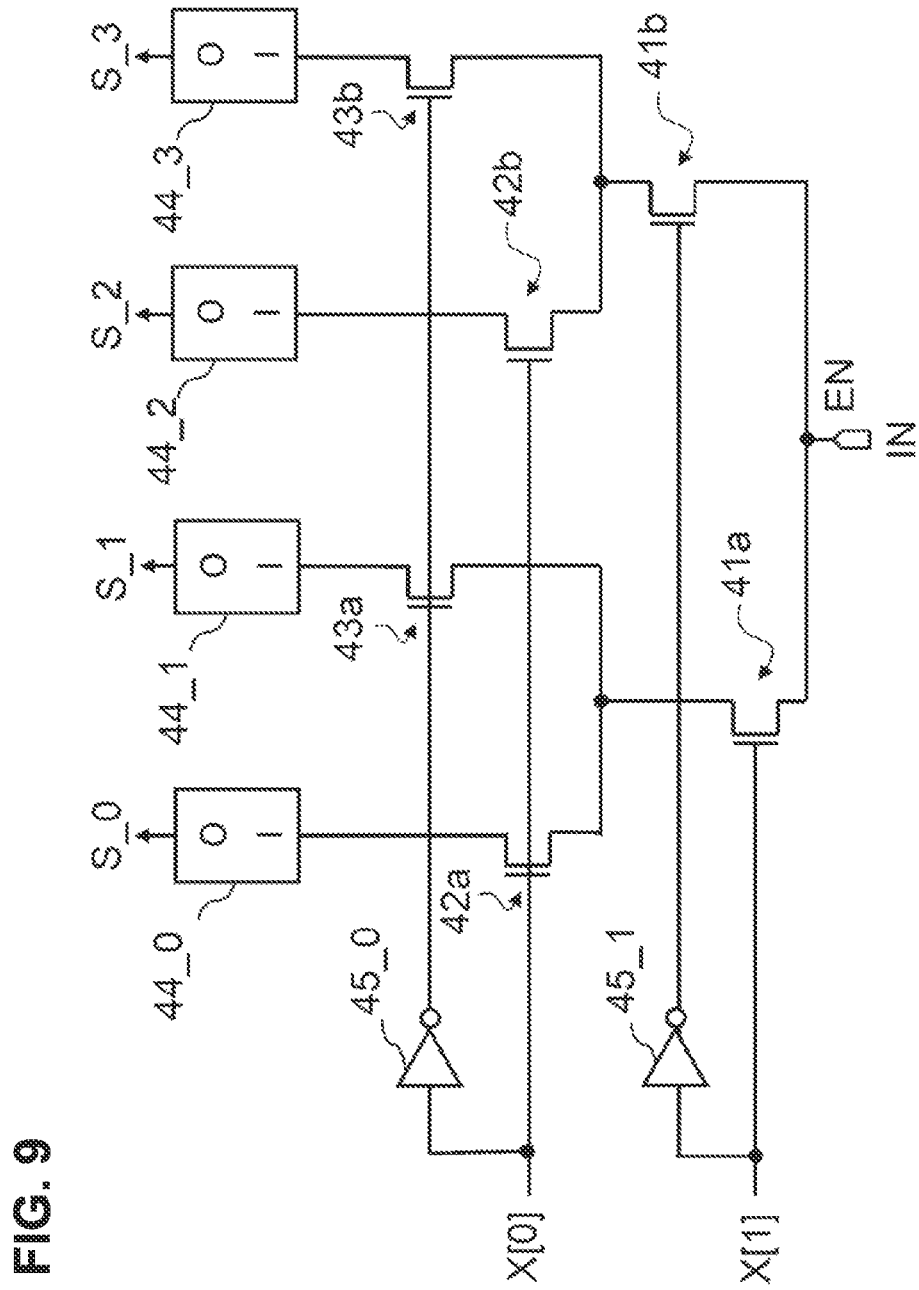
FIG. 9 is a configuration diagram illustrating an example of the selection circuit according to the first embodiment.

The configuration and operation of the selection circuit 40 will be described in more detail with reference to FIG. 9. FIG. 9 shows a configuration of an illustrative selection circuit 40 if k=2 (n=4).

The selection circuit 40 shown in FIG. 9 includes NMOS transistors 41a, 41b, 42a, 42b, 43a, and 43b, inverting circuits 45_0 and 45_1, and output circuits 44_0 to 44_3.

The input of the inverting circuit 45_0 is connected to the input port X[0], and the output of the inverting circuit 45_0 is connected to the gates of the transistors 43a and 43b. The input of the inverting circuit 45_1 is connected to the input port X[1], and the output of the inverting circuit 45_1 is connected to the gate of the transistor 41b. The gate of the transistor 41a is connected to the input port X[1], and the gates of the transistors 42a and 42b are connected to the input port X[0].

The transistor 42a is connected between the transistor 41a and the input terminal I of the output circuit 44_0, the transistor 43a is connected between the transistor 41a and the input terminal I of the output circuit 44_1, the transistor 42b is connected between the transistor 41b and the input terminal I of the output circuit 44_2, and the transistor 43b is connected between the transistor 41b and the input terminal I of the output circuit 44_3.

Address information to be input to the selection circuit 40 is expressed as 2-bit logic signals. As discussed below, the selection circuit 40 operates as a decoder that converts 2-bit address information for selecting the memory cell MC_i (i=0, 1, 2, 3) into the cell-select signal S_i for selecting the memory cell MC_i.

When the selection circuit 40 operates, an L-level enable signal EN is input to an input terminal IN of the selection circuit 40. In this state, when "0" and "0" are input to the input ports X[1] and X[0], respectively, the transistors 41b, 43a, and 43b are turned on, and the rest of the transistors remain OFF. Therefore, the input terminal I of the output circuit 44_3 corresponding to the memory cell MC_3 becomes the L level through the transistors 41b and 43b, and the output of the inverting circuit 442 becomes an H level. As a result, an H-level cell-select signal S_3 is output from the output terminal O.

When "0" and "1" are input to the input ports X[1] and X[0], respectively, the transistors 41b, 42a, and 42b are turned on, and the rest of the transistors remain OFF. Therefore, the input terminal I of the output circuit 44_2 corresponding to the memory cell MC_2 becomes the L level through the transistors 41b and 42b, and the output of the inverting circuit 442 becomes an H level. As a result, an H-level cell-select signal S_2 is output from the output terminal O.

When "1" and "0" are input to the input ports X[1] and X[0], respectively, the transistors 41a, 43a, and 43b are turned on, and the rest of the transistors remain OFF. Therefore, the input terminal I of the output circuit 44_1 corresponding to the memory cell MC_1 becomes the L level through the transistors 41a and 43a, and the output of the inverting circuit 442 becomes an H level. As a result, an H-level cell-select signal S_1 is output from the output terminal O.

When "1" and "1" are input to the input ports X[1] and X[0], respectively, the transistors 41a, 42a, and 42b are turned on, and the rest of the transistors remain OFF. Therefore, the input terminal I of the output circuit 44_0 corresponding to the memory cell MC_0 becomes the L level through the transistors 41a and 42a, and the output of the inverting circuit 442 becomes an H level. As a result, an H-level cell-select signal S_0 is output from the output terminal O.

The H-level cell-select signal S_i output from the output circuit 44_i (i=0, 1, 2, 3) is fed to the gate of the access transistor 12_i and the gate of the transistor 13_i through the selection signal line corresponding to the MTJ device 11_i to turn on the access transistor 12_i and the transistor 13_i. This allows the write circuit 20 and the read circuit 30 to write data to the MTJ device 11_i and read data from the MTJ device 11_i, respectively.

As described above, according to the lookup table circuit 100 of the first embodiment, the selection circuit 40 having a plurality of transistors connected in a tree structure with multiple levels is separated from the read-current path PA. With this structure, data can be read from the memory cell array 10 without passing through the selection circuit 40, which makes it possible to enhance the read margin regardless of types of the sense amplifier of the read circuit 30. Even if the difference (resistance difference) between the high resistance and the low resistance corresponding to the data written in the MTJ device 11_i is small, the voltage required for reading by the single-ended sense amplifier can be easily obtained. Therefore, the configuration in which the selection circuit 40 is separated from the read-current path PA is particularly effective in enhancement of the read margin of the single-ended sense amplifier. Moreover, the lookup table circuit 100 not only provides an area-saving circuit structure, but also makes it possible to reduce delay time.

Second Embodiment

Next, a second embodiment of the invention will be described with reference to FIGS. 10 to 16. In the following second embodiment, the differences from the first embodiment will be described.

In the second embodiment, reference will be made to a lookup table circuit that has two modes and is fracturable by switching between the modes. The second embodiment demonstrates an example in which the number of bits of the logic signal is k=6 and the number of memory cells is $n=2^k=64$.

Figure 10:
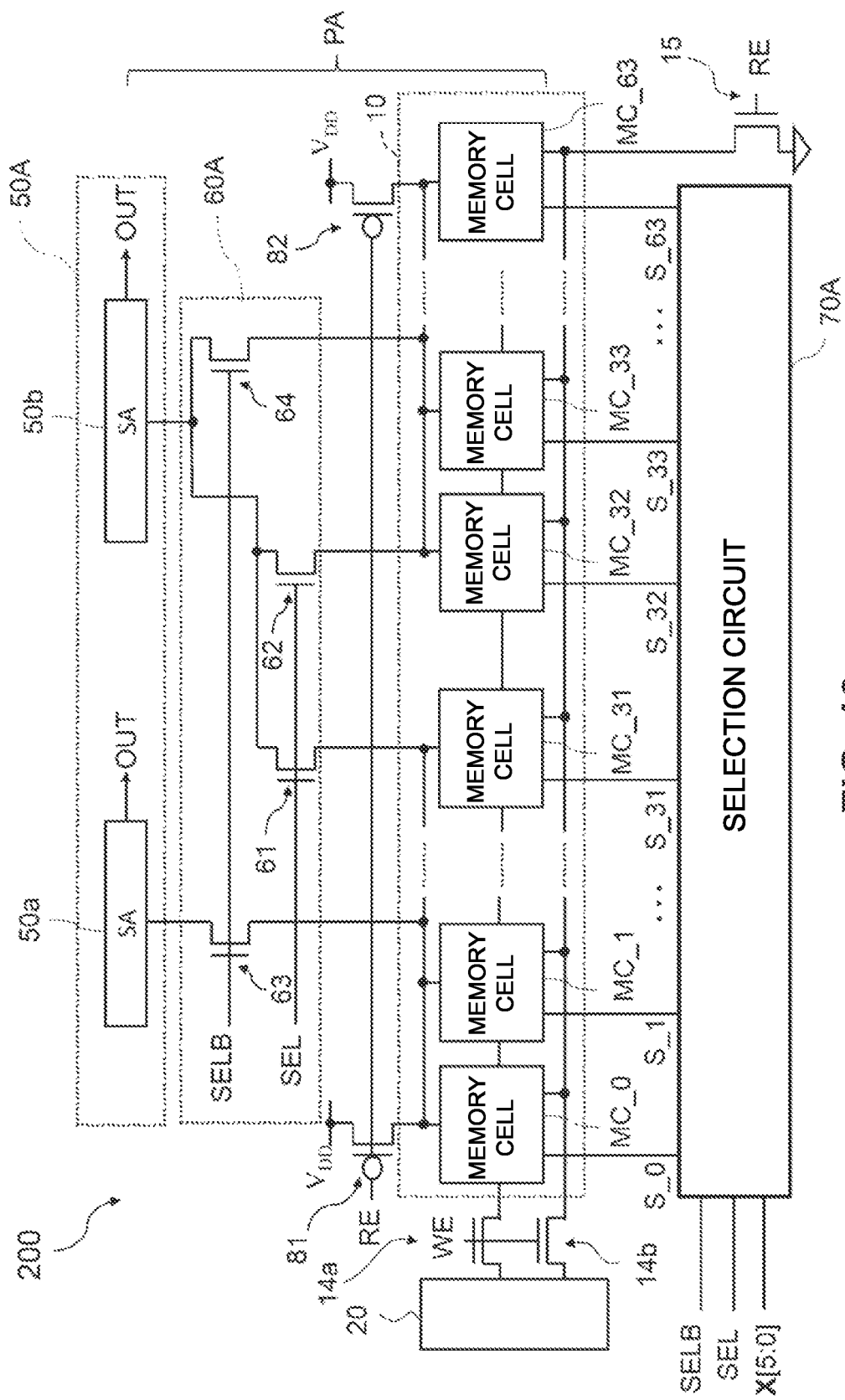
FIG. 10 is a schematic diagram illustrating a configuration of a lookup table circuit according to a second embodiment of the invention.

FIG. 10 shows a configuration of a nonvolatile lookup table circuit 200 according to the second embodiment. The lookup table circuit 200 includes a memory cell array 10, a write circuit 20, a read circuit 50A, a mode selector 60A, and a selection circuit 70A. The memory cell array 10 is connected to the read circuit 50A through the mode selector 60A, and is also connected to the write circuit 20 and the selection circuit 70A. As shown in FIG. 10, the selection circuit 70A is separated from the path PA along which the read circuit 50A reads data from the memory cell array 10.

A PMOS pre-charge transistor 81 (charging circuit) is connected to the memory cells MC_0 to MC_31, and a PMOS pre-charge transistor 82 (charging circuit) is connected to the memory cells MC_32 to MC_63. A read enable signal RE is input to gates of the pre-charge transistors 81 and 82. When the read enable signal RE is at an L level (RE=0) (that is, during a read operation by the read circuit 50A is not performed), the pre-charge transistors 81 and 82 are turned on to charge the memory cells MC_i to the power supply voltage VDD. This makes it possible to improve the processing speed in reading data from the MTJ device 11_i (RE=1).

The read circuit 50A includes two single-ended sense amplifiers (SAs) 50a and 50b (divided read circuits). The configuration and effect of each of the two sense amplifiers 50a and 50b are the same as the configuration and effect of the read circuit 30 shown in FIG. 6, and thus the description thereof will be omitted.

The mode selector 60A is a circuit that switches between a first mode (SEL=1) and a second mode (SEL=0) by switching the electrical connection between the memory cell array 10 and the sense amplifiers 50a and 50b in response to the input of control signals (SEL, SELB), and includes NMOS mode-select transistors 61 to 64 connected to the memory cell array 10. The mode-select transistors 61 and 63 are connected to the memory cells MC_0 to MC_31, and the mode-select transistors 62 and 64 are connected to the memory cells MC_32 to MC_63. The mode-select transistors 61, 62, and 64 are connected to the sense amplifier 50b, and the mode-select transistor 63 is connected to the sense amplifier 50a.

The control signal SEL is input to gates of the mode-select transistors 61 and 62, and the mode-select transistors 61 and 62 are turned on and off in response to the input of the control signal SEL. The control signal SELB is input to gates of the mode-select transistors 63 and 64, and the mode-select transistors 63 and 64 are turned on and off in response to the input of the control signal SELB.

The mode-select transistors 61 to 64 can be provided for all the memory cells MC_0 to MC_63, which allows the mode-select transistors 61 to 64 to be designed larger than cell-select transistors (the access transistor 12_i and the transistor 13_i) for selecting the MTJ device 11_i as an access target. Specifically, each of the mode-select transistors 61 to 64 has a longer gate width than the cell-select transistor. Therefore, on resistance of each of the mode-select transistors 61 to 64 is smaller than on resistance of the cell-select transistor. Moreover, since the mode selector 60A is shared among the memory cells MC_0 to MC_63, even if the gate width of each of the mode-select transistors 61 to 64 is increased, the area overhead is small. Therefore, by increasing the gate width of each of the mode-select transistors 61 to 64 to reduce the on resistance, it is possible to obtain a larger read voltage difference $\Delta V_{RD}$ depending on the storage state of the MTJ device 11_i (see FIG. 16 to be described later).

Figure 11:
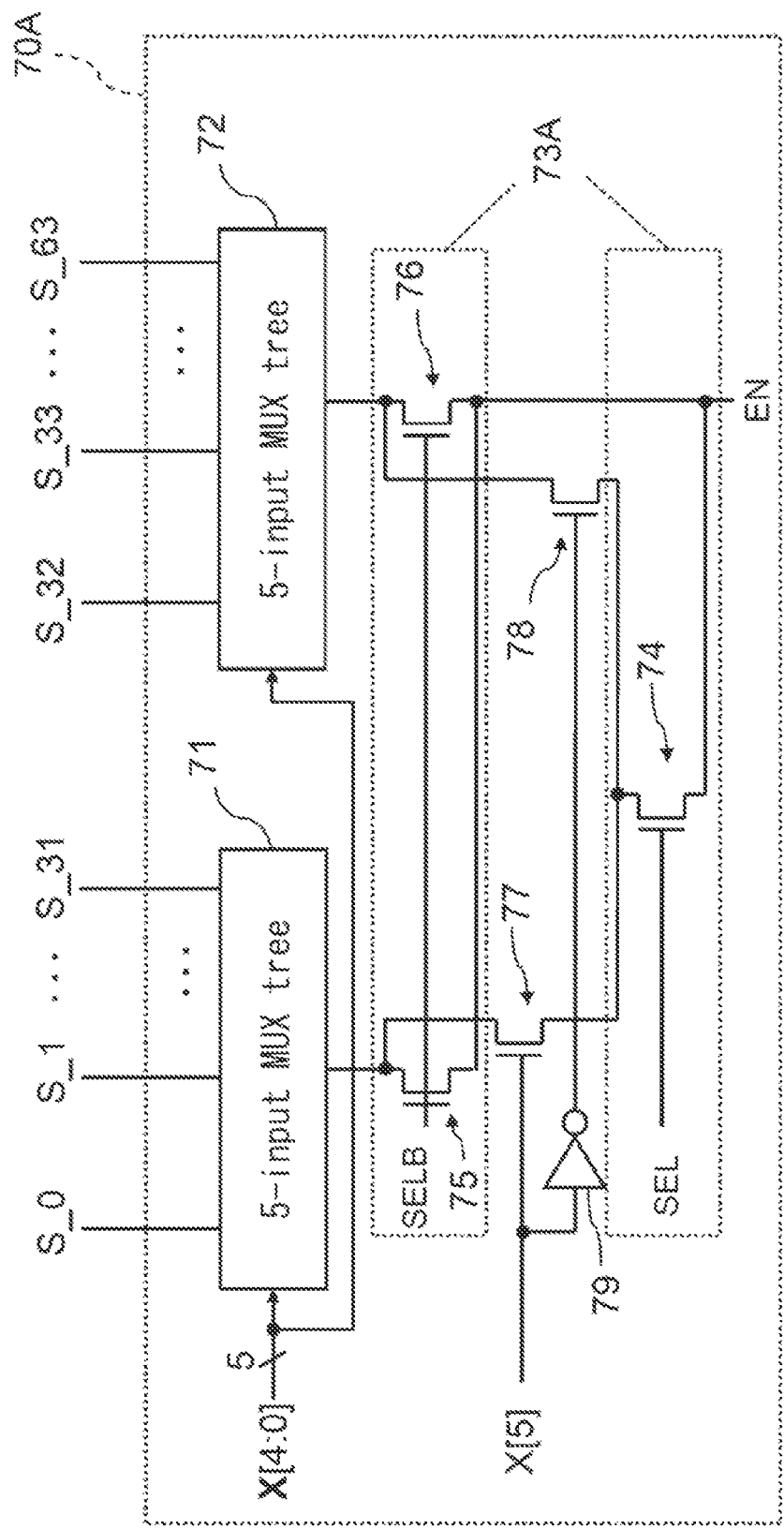
FIG. 11 is a diagram illustrating a configuration of a selection circuit according to the second embodiment shown in FIG. 10.

FIG. 11 shows a configuration of the selection circuit 70A. As shown in FIG. 11, the selection circuit 70A includes 5-input multiplexer trees 71 and 72 (divided selection circuits), a mode switching circuit 73A, NMOS transistors 77 and 78, and an inverting circuit 79.

The configuration of each of the 5-input multiplexer trees 71 and 72 is the same as that of the k-input multiplexer tree (k=5) shown in FIG. 7, and thus the description of the circuit configuration will be omitted.

The 5-input multiplexer tree 71 includes NMOS transistors connected in a tree structure with five levels, and outputs the cell-select signal S_i (i=0, . . . , 31) for selecting one memory cell among the memory cells MC_0 to MC_31, to the memory cell array 10 based on the input of 5-bit logic signals from the input ports X[0] to X[4]. The 5-input multiplexer tree 72 outputs the cell-select signal S_i (i=32, . . . , 63) for selecting one memory cell among the memory cells MC_32 to MC_63, to the memory cell array 10 based on the input of the logic signals which are shared with the 5-input multiplexer tree 71.

The mode switching circuit 73A is a circuit that switches between the first mode (SEL=1) and the second mode (SEL=0) in response to the input of the control signals (SEL, SELB), and includes NMOS transistors 74, 75, and 76. The control signal SEL is input to a gate of the transistor 74, and the control signal SELB is input to a gate of the transistor 75 and a gate of the transistor 76. The enable signal EN is input to the transistors 74, 75, and 76.

The transistor 77 is connected to the 5-input multiplexer tree 71, and a gate of the transistor 77 is connected to an input port X[5]. The transistor 78 is connected to the 5-input multiplexer tree 72, and a gate of the transistor 78 is connected to the output of the inverting circuit 79.

The input of the inverting circuit 79 is connected to the input port X[5], and the output of the inverting circuit 79 is connected to the gate of the transistor 78. The inverting circuit 79 inverts a 1-bit logic signal input from the input port X[5] and outputs the inverted 1-bit logic signal to the gate of the transistor 78.

As described above, since the selection circuit 70A includes the transistors 74 to 76 for mode switching in addition to the transistors that are turned on and off in response to the input of the logic signals from the input ports X[0] to X[5], the number of levels in a tree structure of the transistors is larger than that in the selection circuit 70 of the first embodiment. However, since these transistors are not provided on the read-current path PA, there is no influence on the read margin, and the delay time overhead is small.

Next, the mode switching of the lookup table circuit 200 will be described.

First, the first mode (SEL=1, SELB=0) will be described.

Figure 12:
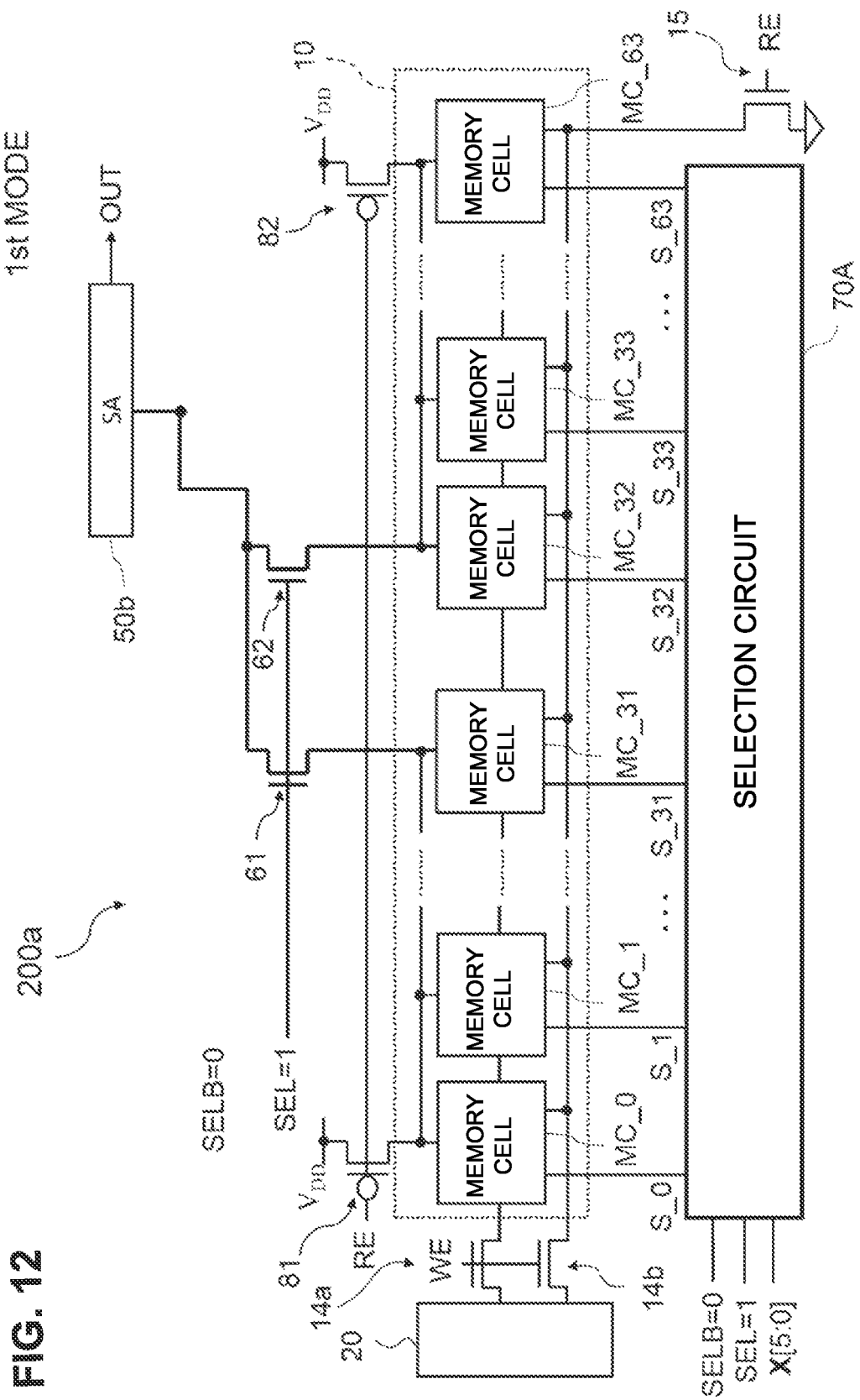
FIG. 12 is a diagram illustrating a single 6-input lookup table circuit configured in a first mode (SEL=1) of the second embodiment.
Figure 13:
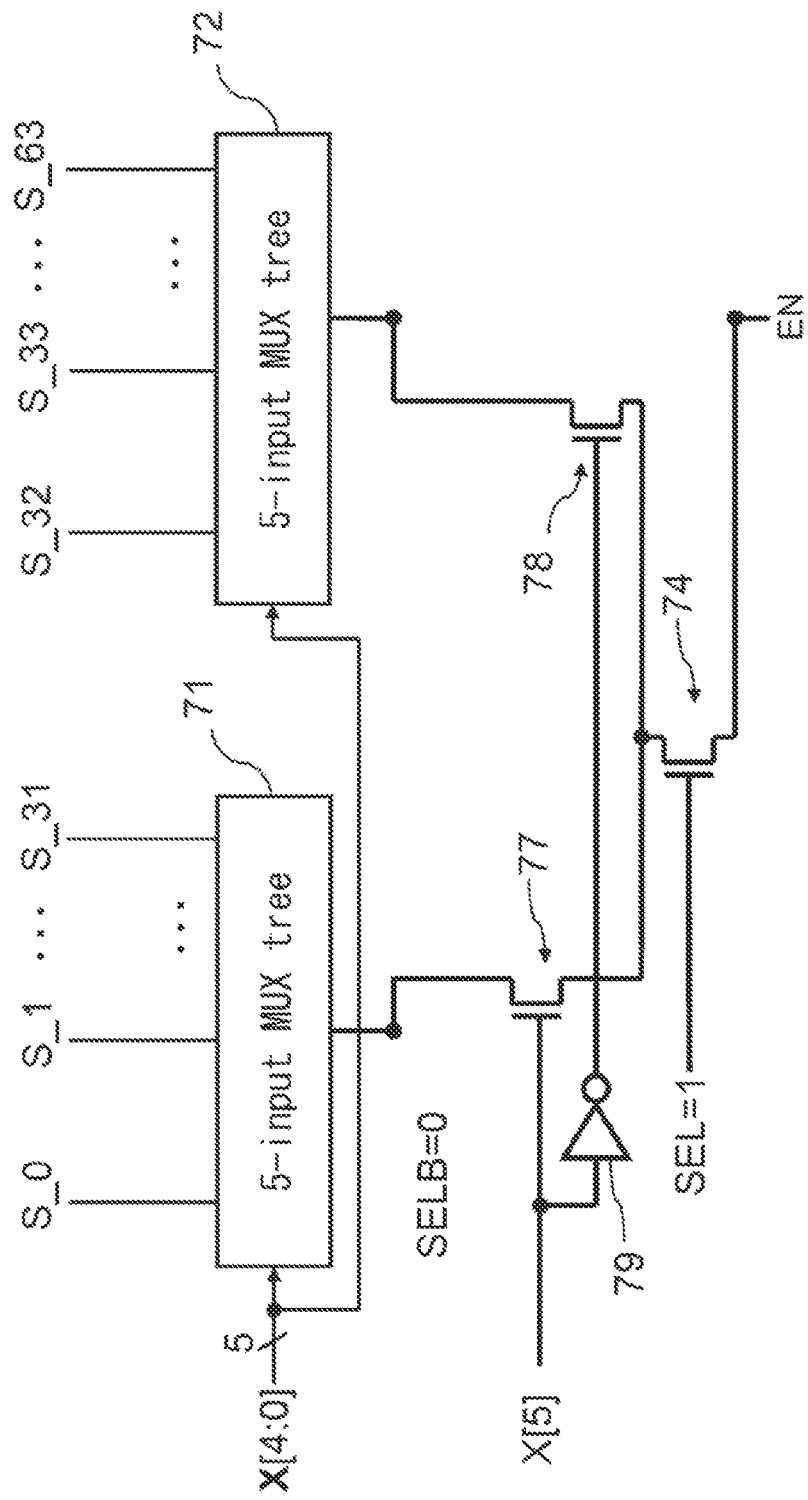
FIG. 13 is a diagram illustrating the selection circuit configured in the first mode of the second embodiment.

FIGS. 12 and 13 show a circuit configured by the lookup table circuit 200 in the first mode. In FIGS. 12 and 13, among the elements of the lookup table circuit 200, only the elements that operate by the H-level control signal (SEL=1) are shown, whereas the elements that do not operate by the L-level control signal (SELB=0) are not shown.

In the first mode, as shown in FIG. 12, the mode-select transistors 61 and 62 of the mode selector 60A are turned on, and thus the memory cell array 10 and the sense amplifier 50b can be electrically connected to each other. In the selection circuit 70A, as shown in FIG. 13, the transistor 74 of the mode switching circuit 73A is turned on.

In the selection circuit 70A, when "1" is input from the input port X[5], the transistor 77 is turned on and the transistor 78 is turned off. As a result, the enable signal EN is output to the 5-input multiplexer tree 71 through the transistors 74 and 77 to activate the 5-input multiplexer tree 71. The cell-select signal S_i for selecting one of the memory cells MC_0 to MC_31 is then output from the 5-input multiplexer tree 71. The data written in the memory cell MC_i selected by the cell-select signal S_i is read by the sense amplifier 50b through the mode-select transistor 61. The read voltage $V_{RD}$ of the sense amplifier 50b is defined by a combined resistance of the resistance (high resistance, low resistance) corresponding to the data written in the memory cell MC_i selected by the cell-select signal S_i and the resistance of the mode-select transistor 61.

When "0" is input from the input port X[5], the transistor 77 is turned off and the transistor 78 is turned on. As a result, the enable signal EN is output to the 5-input multiplexer tree 72 through the transistors 74 and 78 to activate the 5-input multiplexer tree 72. The cell-select signal S_i for selecting one of the memory cells MC_32 to MC_63 is then output from the 5-input multiplexer tree 72. The data written in one memory cell MC_i selected by the cell-select signal S_i is read by the sense amplifier 50b through the mode-select transistor 62. The read voltage $V_{RD}$ of the sense amplifier 50b is defined by the combined resistance of the resistance corresponding to the data written in the memory cell MC_i selected by the cell-select signal S_i and the resistance of the mode-select transistor 62.

As described above, in the first mode, a single cell-select signal S_i is output in response to the input of the 6-bit logic signals to the selection circuit 70A, and the data written in one memory cell MC_i selected by the single cell-select signal S_i is read by the single sense amplifier 50b and output as an operation result of a single logic function. That is, in the first mode, the selection circuit 70A operates as a single 64-to-1 multiplexer, and the lookup table circuit 200 operates as a single 6-input lookup table circuit 200a.

Next, the second mode (SELB=1, SEL=0) will be described.

Figure 14:
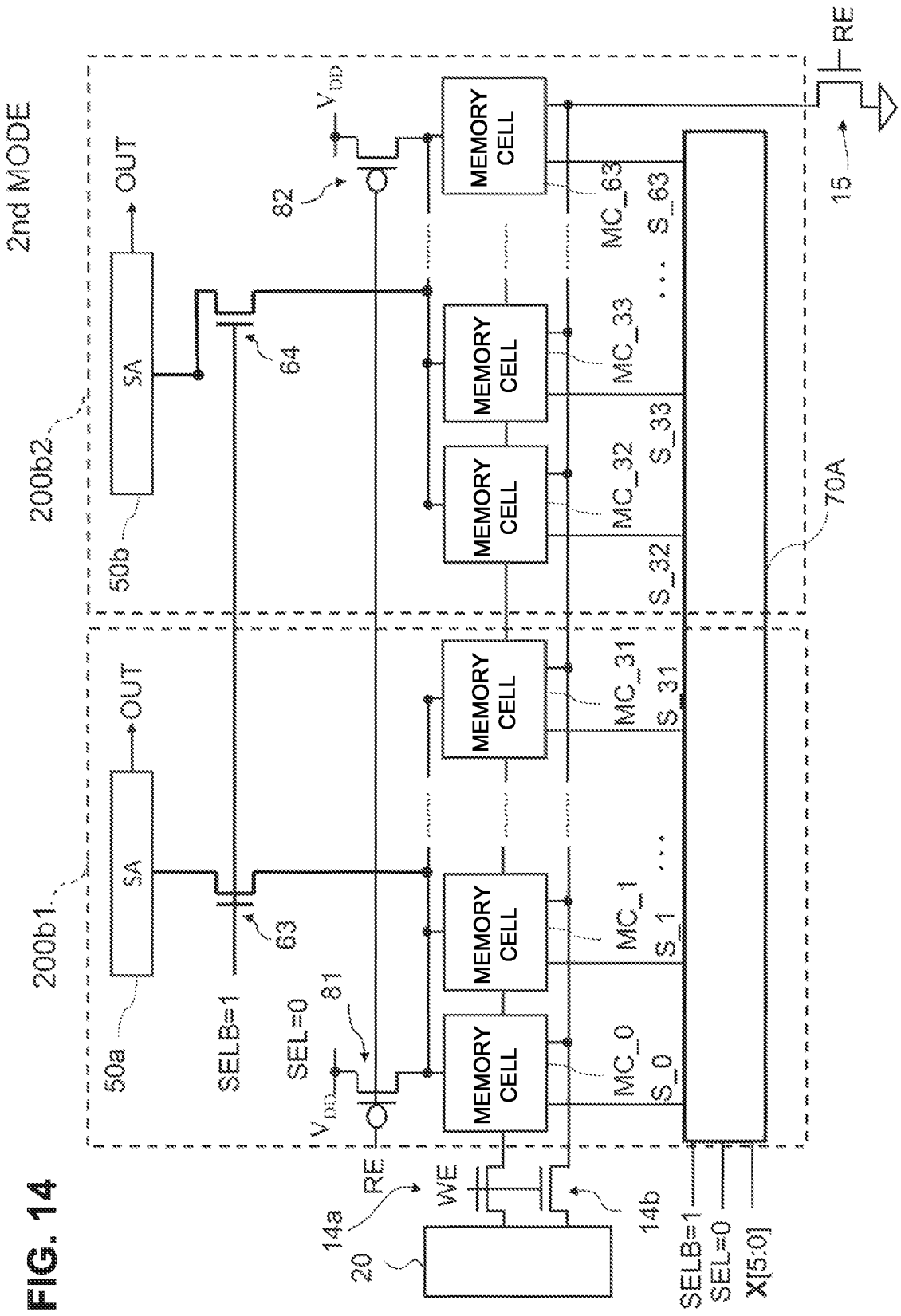
FIG. 14 is a diagram illustrating two 5-input lookup table circuits configured in a second mode (SEL=0) of the second embodiment.
Figure 15:
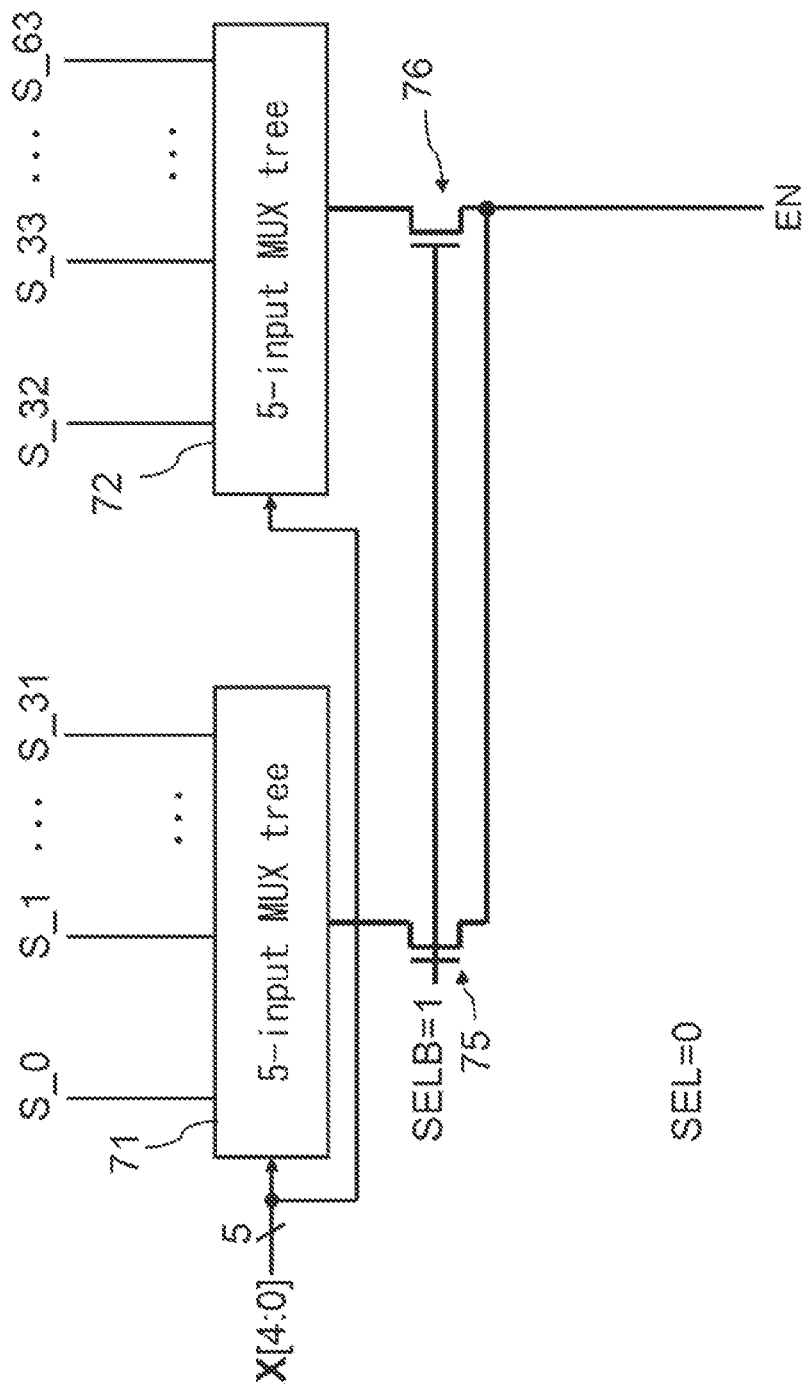
FIG. 15 is a diagram illustrating the selection circuit configured in the second mode of the second embodiment.

FIGS. 14 and 15 show a circuit configured by the lookup table circuit 200 in the second mode. In FIGS. 14 and 15, among the elements of the lookup table circuit 200, only the elements that operate by the H-level control signal (SELB=1) are shown, whereas the elements that do not operate by the L-level control signal (SEL=0) are not shown.

In the second mode, as shown in FIG. 14, the mode-select transistors 63 and 64 of the mode selector 60A are turned on, and thus the sense amplifier 50a and the memory cells MC_0 to MC_31 can be electrically connected to each other, and the sense amplifier 50b and the memory cells MC_32 to MC_63 can be electrically connected to each other. In the selection circuit 70A, as shown in FIG. 15, the transistors 75 and 76 of the mode switching circuit 73A are turned on.

The enable signal EN is output to the 5-input multiplexer tree 71 through the transistor 75, and is output to the 5-input multiplexer tree 72 through the transistor 76, which activates both the 5-input multiplexer trees 71 and 72.

From the 5-input multiplexer tree 71, the cell-select signal S_i for selecting one memory cell among the memory cells MC_0 to MC_31 is output. The data written in the memory cell MC_i selected by the cell-select signal S_i is read by the sense amplifier 50a through the mode-select transistor 63. The read voltage $V_{RD}$ of the sense amplifier 50a is defined by the combined resistance of the resistance (high resistance, low resistance) corresponding to the data written in the memory cell MC_i selected by the cell-select signal S_i and the resistance of the mode-select transistor 63.

From the 5-input multiplexer tree 72, the cell-select signal S_i for selecting one memory cell among the memory cells MC_32 to MC_63 is output. The data written in the memory cell MC_i selected by the cell-select signal S_i is read by the sense amplifier 50b through the mode-select transistor 64. The read voltage $V_{RD}$ of the sense amplifier 50b is defined by the combined resistance of the resistance corresponding to the data written in the memory cell MC_i selected by the cell-select signal S_i and the resistance of the mode-select transistor 64.

As described above, in the second mode, two cell-select signals S_i are output in response to the input of the 5-bit logic signals (a part of the 6-bit logic signals) to the selection circuit 70A, and the data written in the two memory cells MC_i selected by the two cell-select signals S_i is read by the two sense amplifiers 50a and 50b, respectively, and output as operation results of two logic functions. That is, in the second mode, the selection circuit 70A operates as two 32-to-1 multiplexers, and the lookup table circuit 200 operates as two 5-input lookup table circuits 200b1 and 200b2.

Next, the effects of improving the read margin according to the second embodiment will be described.

Figure 1:
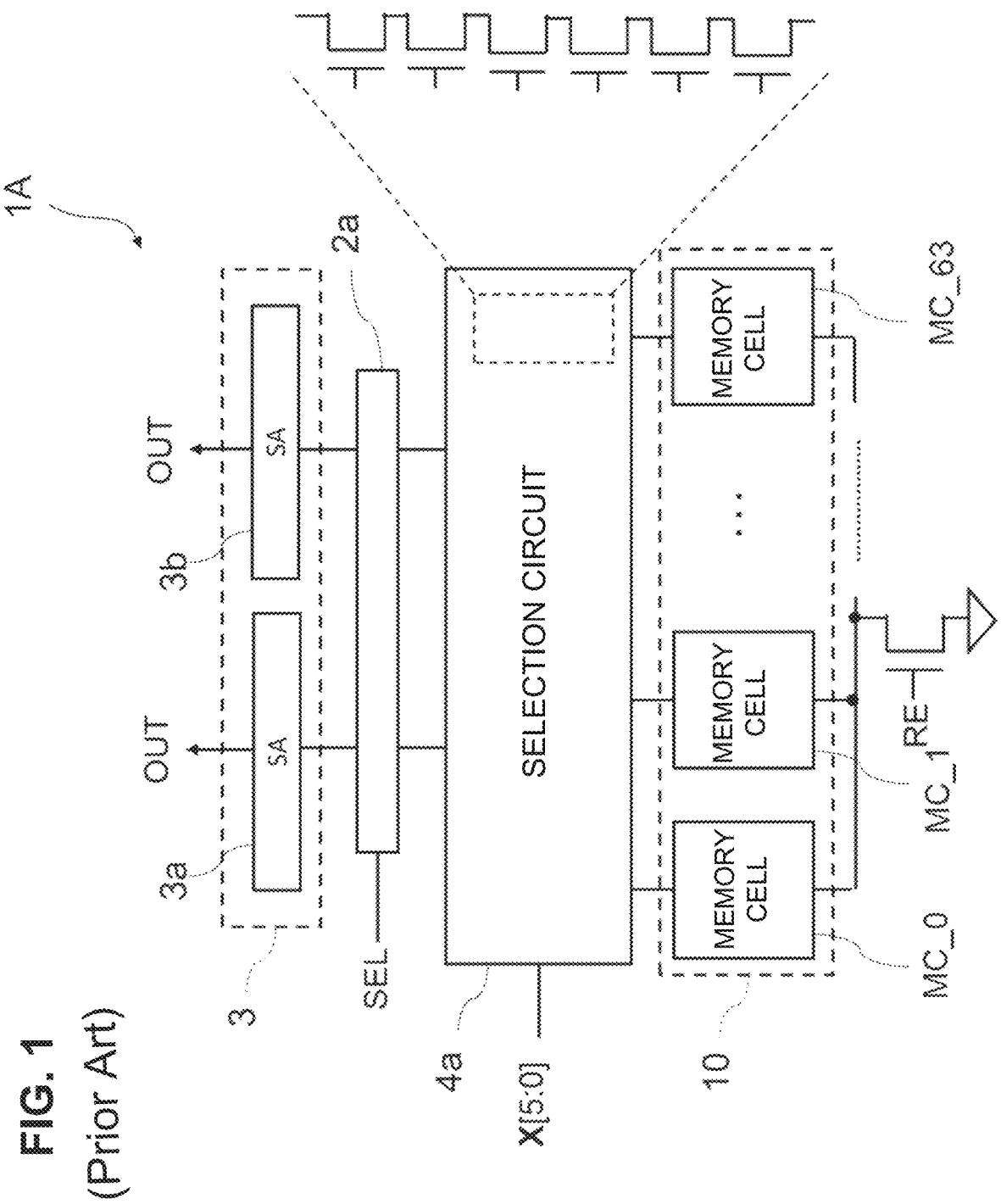
FIG. 1 is a block diagram illustrating an example of a conventional lookup table circuit.
Figure 2:
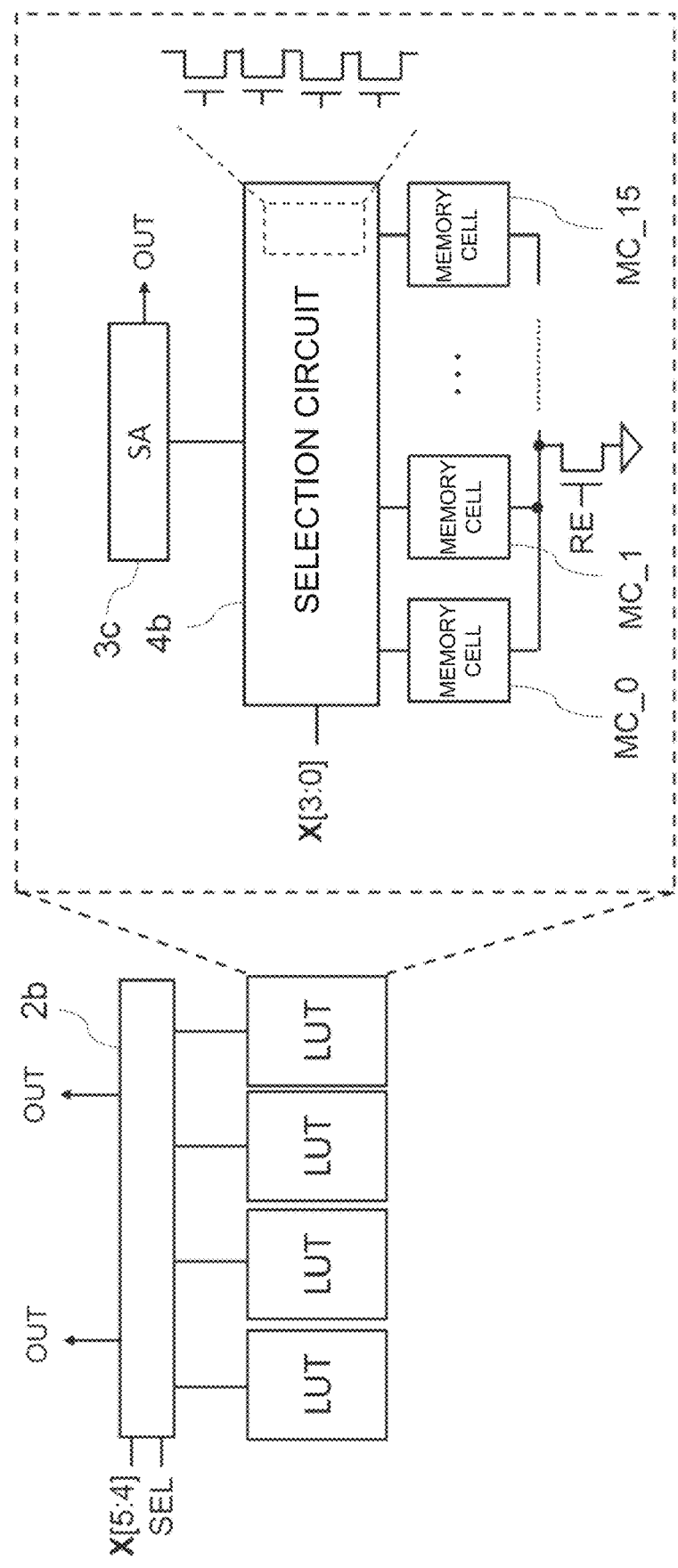
FIG. 2 is a block diagram illustrating another example of a conventional lookup table circuit.
Figure 16:
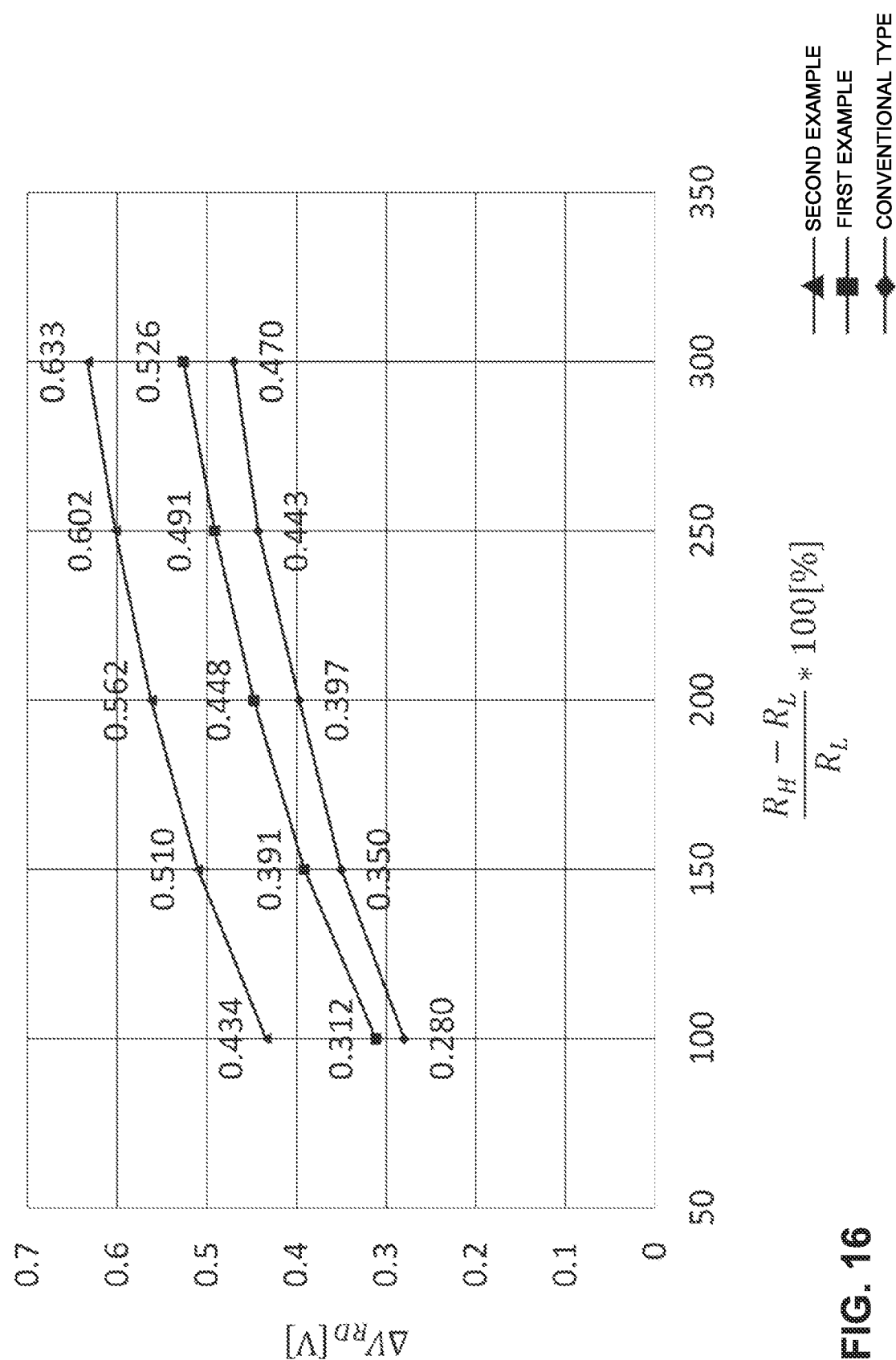
FIG. 16 is a graph illustrating effects of improving a read margin.

FIG. 16 shows comparison results of the read margin between the conventional fracturable lookup table circuit 1A ("Conventional Type") shown in FIG. 1 and the fracturable lookup table circuit 200 ("First Example" and "Second Example") of the second embodiment shown in FIG. 10. Specifically, in FIG. 16, data plots of the read voltage difference $\Delta V_{RD}$ (V)=$V_H$-$V_L$ with respect to the resistance ratio (%)=$\{(R_H-R_L)/R_L\}\times 100$(%) are shown to evaluate the read margin. Here, $R_H$ and $R_L$ indicate a high resistance value (data 1) and a low resistance value (data 0) of the MTJ device 11_i, respectively. FIG. 16 shows the results when $R_L$=10 kOhm. $V_H$ and $V_L$ are voltages when the read circuit 50A reads data 1 and data 0 from the MTJ device 11_i, respectively.

In FIG. 16, "First Example" shows data plots when the on resistance of each of the mode-select transistors 61 to 64 of the mode selector 60A is the same as the on resistance of the cell-select transistors (access transistor 12_i and transistor 13_i), and "Second Example" shows data plots when the on resistance of each of the mode-select transistors 61 to 64 of the mode selector 60A is smaller than the on resistance of the cell-select transistors (access transistor 12_i and transistor 13_i).

The comparison between "First Example" and "Second Example" of FIG. 16 suggests that the read margin is enhanced as the on resistance of each of the mode-select transistors 61 to 64 decreases. The comparison between "Conventional Type" and "First Example" suggests that even if the on resistance of each of the mode-select transistors 61 to 64 is the same as the on resistance of the cell-select transistor, since the selection circuit 70A is separated from the read-current path PA in the lookup table circuit 200 of the second embodiment, data can be read from the MTJ device 11_i without passing through transistors connected in multiple levels in the selection circuit 70A. This indicates that the read margin is enhanced as compared with the conventional lookup table circuit 1A. In FIG. 16, the comparison between "Conventional Type" and "Second Example" suggests that the effect of improving the read margin is significantly large. For example, when the resistance ratio (%) is 150%, $\Delta V_{RD}$ (V) is increased from 0.350 to 0.510 and the read margin is enhanced by 45.6%.

Third Embodiment

Next, a third embodiment of the invention will be described with reference to FIGS. 17 to 22. In the following third embodiment, the differences from the second embodiment will be mainly described.

In the third embodiment, reference will be made to a lookup table circuit that is a fracturable lookup table circuit and can configure a circuit different from that of the second embodiment by switching between modes. Similar to the second embodiment, the third embodiment demonstrates an example in which the number of bits of the logic signal is k=6 and the number of memory cells is n=$2^k$=64.

Figure 17:
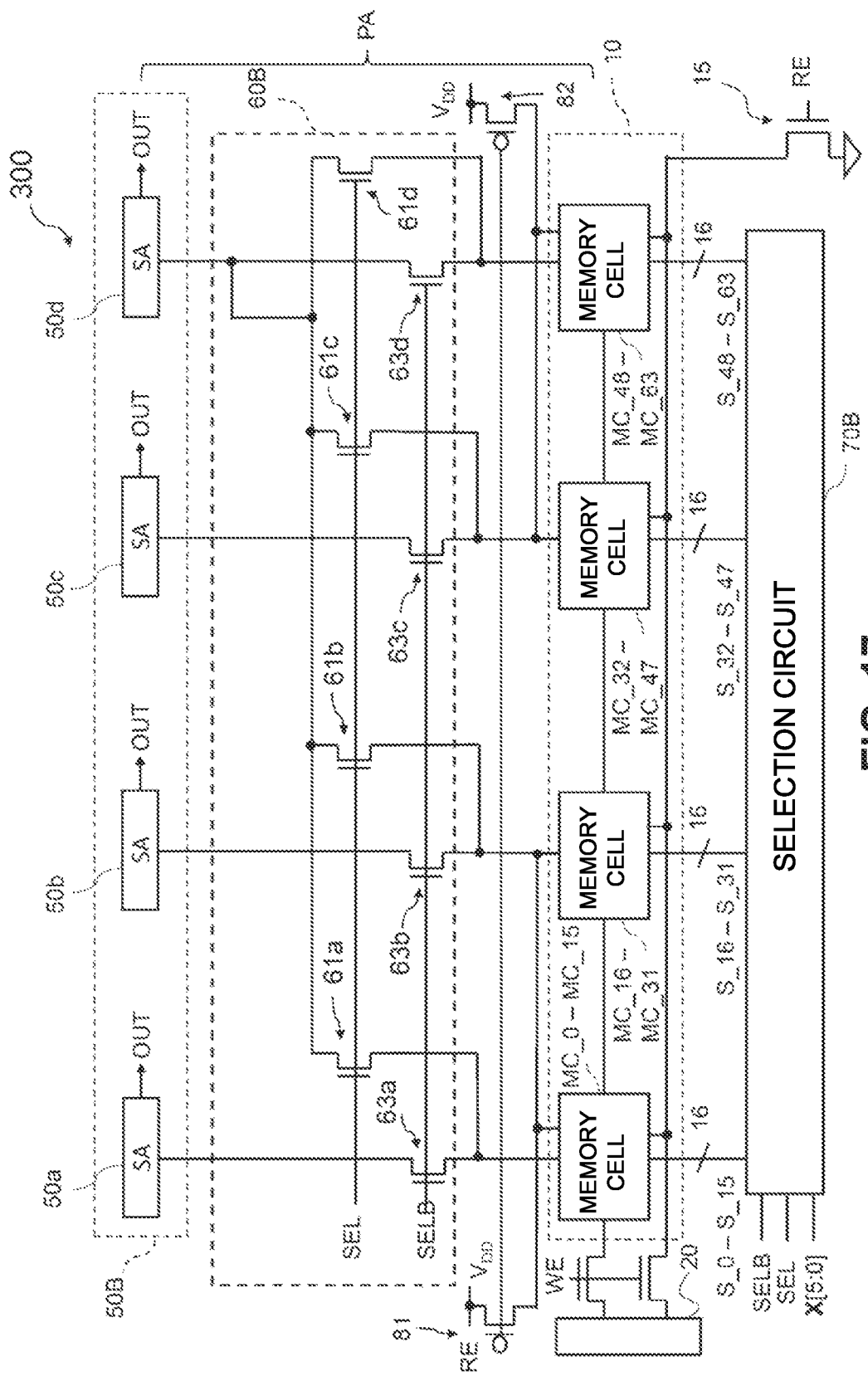
FIG. 17 is a schematic diagram illustrating a configuration of a lookup table circuit according to a third embodiment of the invention.

FIG. 17 shows a configuration of a nonvolatile lookup table circuit 300 according to the third embodiment. The lookup table circuit 300 includes a memory cell array 10, a write circuit 20, a read circuit 50B, a mode selector 60B, and a selection circuit 70B. The memory cell array 10 is connected to the read circuit 50B through the mode selector 60B, and is also connected to the write circuit 20 and the selection circuit 70B. As shown in FIG. 17, the selection circuit 70B is separated from the path PA along which the read circuit 50B reads data from the memory cell array 10.

Similar to the second embodiment, the PMOS pre-charge transistors 81 and 82 (charging circuits) are connected to the memory cell array 10.

The read circuit 50B includes four single-ended sense amplifiers (SAs) 50a to 50d (divided read circuits). The configuration and effect of each of the four sense amplifiers 50a to 50d are the same as the configuration and effect of the read circuit 30 shown in FIG. 6, and thus the description thereof will be omitted.

The mode selector 60B is a circuit that switches between the first mode (SEL=1) and the second mode (SEL=0) by switching the electrical connection between the memory cell array 10 and the sense amplifiers 50a to 50d in response to the input of the control signals (SEL, SELB), and includes NMOS mode-select transistors 61a, 61b, 61c, 61d, 63a, 63b, 63c, and 63d.

The mode-select transistors 61a and 63a are connected to the memory cells MC_0 to MC_15, the mode-select transistors 61b and 63b are connected to the memory cells MC_16 to MC_31, the mode-select transistors 61c and 63c are connected to the memory cells MC_32 to MC_47, and the mode-select transistors 61d and 63d are connected to the memory cells MC_48 to MC_63.

The mode-select transistors 61a, 61b, 61c, 61d, and 63d are connected to the sense amplifier 50d, and the mode-select transistors 63a, 63b, and 63c are connected to the sense amplifiers 50a, 50b, and 50c, respectively.

The control signal SEL is input to gates of the mode-select transistors 61a, 61b, 61c, and 61d, and the mode-select transistors 61a, 61b, 61c, and 61d are turned on and off in response to the input of the control signal SEL. The control signal SELB is input to gates of the mode-select transistors 63a, 63b, 63c, and 63d, and the mode-select transistors 63a, 63b, 63c, and 63d are turned on and off in response to the input of the control signal SELB.

The mode-select transistors 61a, 61b, 61c, 61d, 63a, 63b, 63c, and 63d of the mode selector 60B can be provided for all the memory cells MC_0 to MC_63, which allows the mode-select transistors 61a, 61b, 61c, 61d, 63a, 63b, 63c, and 63d to be designed larger than the access transistor 12_i and the transistor 13_i that are cell-select transistors. Specifically, each of these mode-select transistors has a larger gate width than the cell-select transistor. Therefore, the on resistance of each of these mode-select transistors is smaller than the on resistance of the cell-select transistor. Moreover, since the mode selector 60B is shared among the memory cells MC_0 to MC_63, even if the gate width of each mode-select transistor is increased, the area overhead is small. Therefore, by increasing the gate width of each mode-select transistor to reduce the on resistance, it is possible to obtain a larger read voltage difference $\Delta V_{RD}$ depending on the storage state of the MTJ device 11_$i$.

Figure 18:
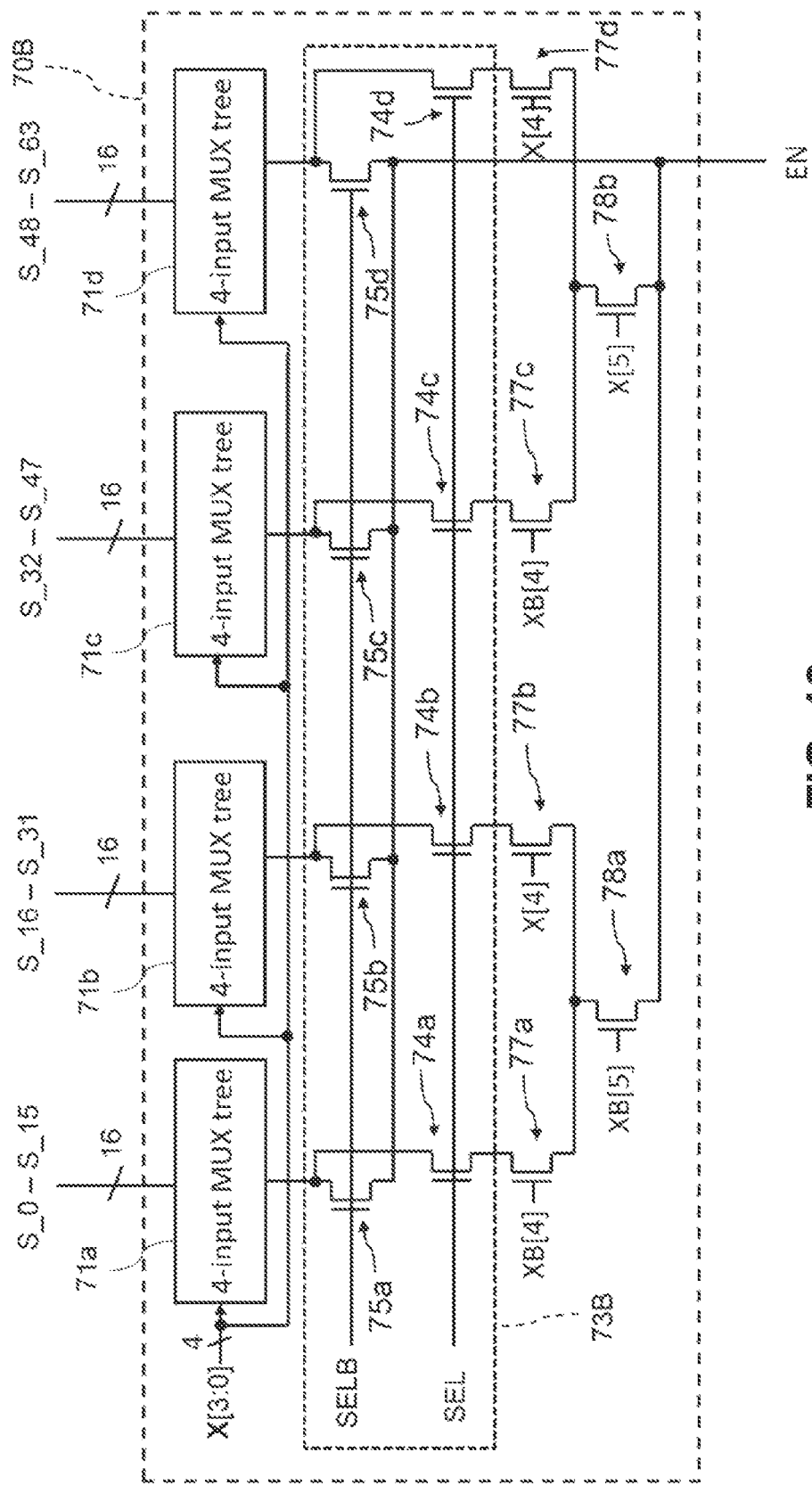
FIG. 18 is a diagram illustrating a configuration of a selection circuit according to the third embodiment shown in FIG. 17.

FIG. 18 shows a configuration of the selection circuit 70B. As shown in FIG. 18, the selection circuit 70B includes 4-input multiplexer trees 71a, 71b, 71c, and 71d (divided selection circuits), a mode switching circuit 73B, and NMOS transistors 77a, 77b, 77c, 77d, 78a, and 78b.

The configuration of each of the 4-input multiplexer trees 71a, 71b, 71c, and 71d is the same as that of the k-input multiplexer tree (k=4) shown in FIG. 7, and thus the description of the circuit configuration will be omitted.

Each of the 4-input multiplexer trees 71a, 71b, 71c, and 71d includes NMOS transistors connected in a tree structure with four levels. The 4-input multiplexer trees 71a, 71b, 71c, and 71d share 4-bit logic signals which are input from the input ports X[0] to X[3].

The 4-input multiplexer tree 71a outputs the cell-select signal S_$i$ ($i$=0, . . . , 15) for selecting one memory cell among the memory cells MC_0 to MC_15 to the memory cell array 10 based on the input of the logic signals. The 4-input multiplexer tree 71b outputs the cell-select signal S_$i$ ($i$=16, . . . , 31) for selecting one memory cell among the memory cells MC_16 to MC_31 to the memory cell array 10 based on the input of the logic signals. The 4-input multiplexer tree 71c outputs the cell-select signal S_$i$ ($i$=32, . . . , 47) for selecting one memory cell among the memory cells MC_32 to MC_47 to the memory cell array 10 based on the input of the logic signals. The 4-input multiplexer tree 71d outputs the cell-select signal S_$i$ ($i$=48, . . . , 63) for selecting one memory cell among the memory cells MC_48 to MC_63 to the memory cell array 10 based on the input of the logic signals.

The mode switching circuit 73B is a circuit that switches between the first mode (SEL=1) and the second mode (SEL=0) in response to the input of the control signals (SEL, SELB), and includes NMOS transistors 74a, 74b, 74c, 74d, 75a, 75b, 75c, and 75d.

The transistors 74a and 75a are connected to the 4-input multiplexer tree 71a, the transistors 74b and 75b are connected to the 4-input multiplexer tree 71b, the transistors 74c and 75c are connected to the 4-input multiplexer tree 71c, and the transistors 74d and 75d are connected to the 4-input multiplexer tree 71d. The control signal SEL is input to gates of the transistors 74a, 74b, 74c, and 74d, and the control signal SELB is input to gates of the transistors 75a, 75b, 75c, and 75d.

The transistor 77a is connected to the 4-input multiplexer tree 71a through the transistor 74a. The transistor 77b is connected to the 4-input multiplexer tree 71b through the transistor 74b. The transistor 77c is connected to the 4-input multiplexer tree 71c through the transistor 74c. The transistor 77d is connected to the 4-input multiplexer tree 71d through the transistor 74d.

Gates of the transistors 77b and 77d are connected to the input port X[4]. The input port X[4] is connected to the input of an inverting circuit (not shown), and the output of the inverting circuit is connected to gates of the transistors 77a and 77c. Hereinafter, the output of the inverting circuit is referred to as an input port XB[4].

The transistor 78a is connected to the 4-input multiplexer tree 71a through the transistors 77a and 74a, and is connected to the 4-input multiplexer tree 71b through the transistors 77b and 74b. The transistor 78b is connected to the 4-input multiplexer tree 71c through the transistors 77c and 74c, and is connected to the 4-input multiplexer tree 71d through the transistors 77d and 74d.

A gate of the transistor 78b is connected to the input port X[5]. The input port X[5] is connected to the input of an inverting circuit (not shown), and the output of the inverting circuit is connected to a gate of the transistor 78a. Hereinafter, the output of the inverting circuit is referred to as an input port XB[5].

The enable signal EN is input to the transistors 75a, 75b, 75c, 75d, 78a, and 78b.

As described above, since the selection circuit 70B includes the transistors 74a, 74b, 74c, 74d, 75a, 75b, 75c, and 75d for mode switching in addition to the transistors that are turned on and off in response to the input of the logic signals from the input ports X[0] to X[5], XB[4], and XB[5], the number of levels in a tree structure of the transistors is larger than that in the selection circuit 70 of the first embodiment. However, since these transistors are not provided on the read-current path PA, there is no influence on the read margin, and the delay time overhead is small.

Next, the mode switching of the lookup table circuit 300 will be described.

First, the first mode (SEL=1, SELB=0) will be described.

Figure 19:
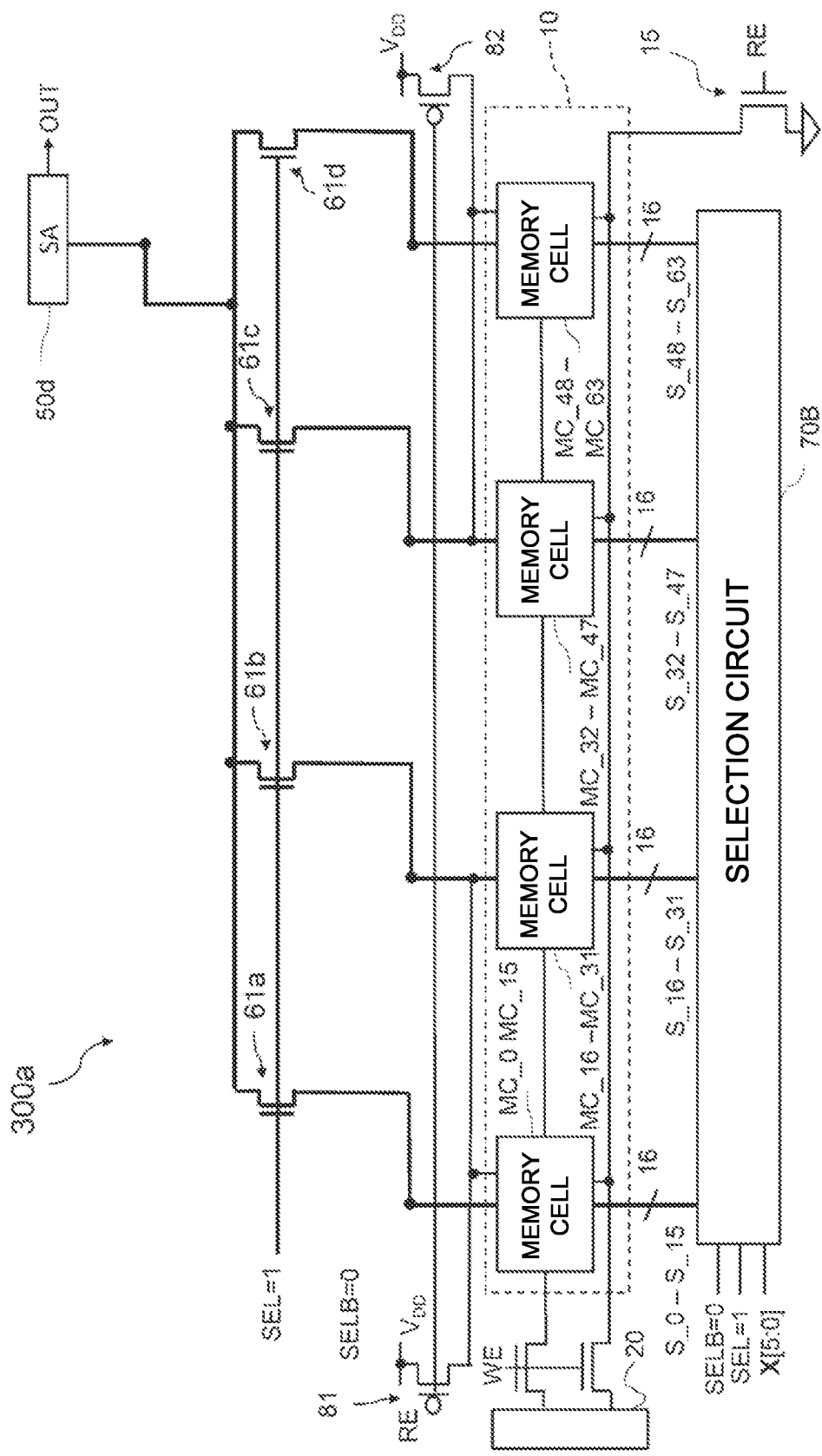
FIG. 19 is a diagram illustrating a single 6-input lookup table circuit configured in a first mode (SEL=1) of the third embodiment.
Figure 20:
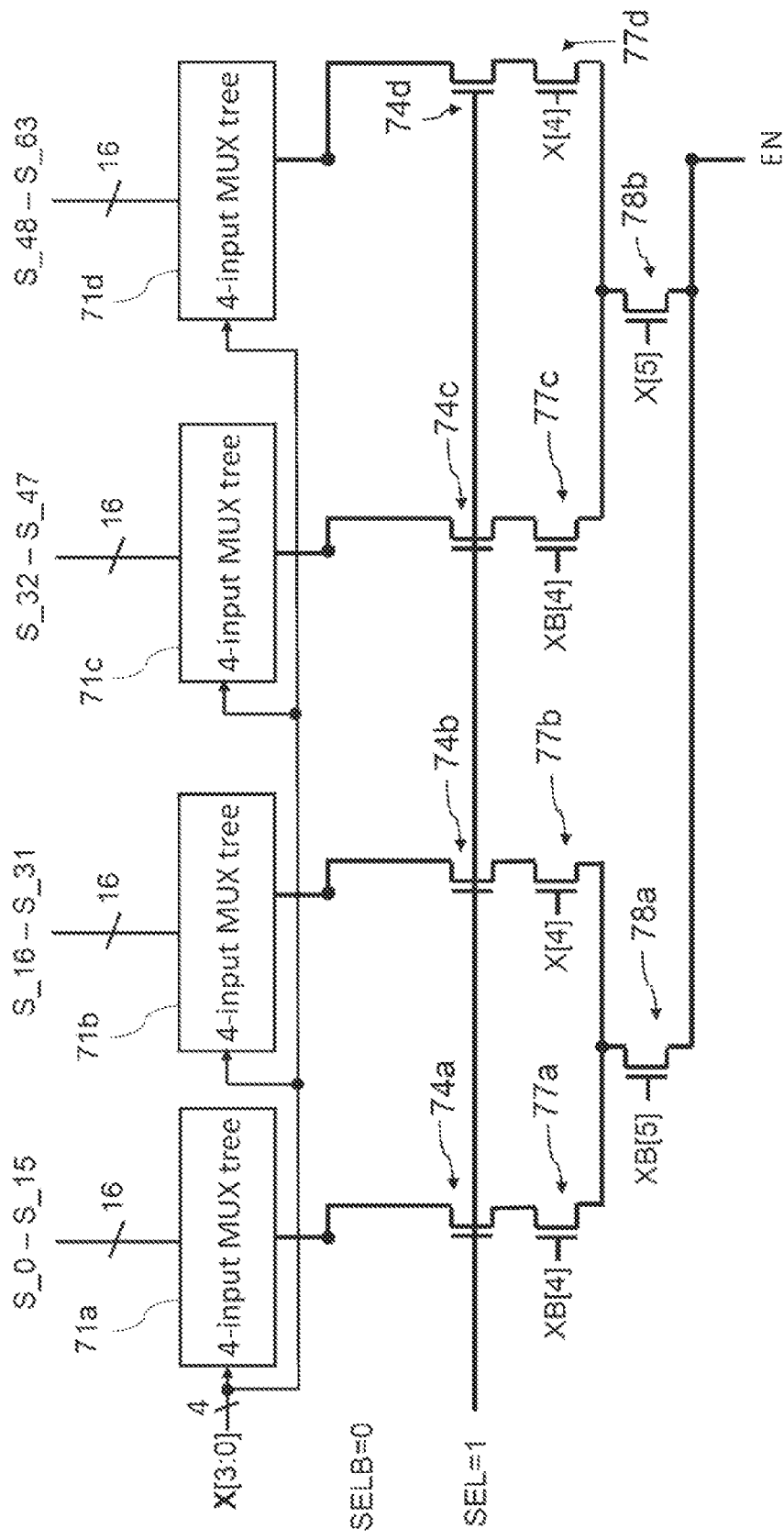
FIG. 20 is a diagram illustrating the selection circuit configured in the first mode of the third embodiment.

FIGS. 19 and 20 show a circuit configured by the lookup table circuit 300 in the first mode. In FIGS. 19 and 20, among the elements of the lookup table circuit 300, only the elements that operate by the H-level control signal (SEL=1) are shown, whereas the elements that do not operate by the L-level control signal (SELB=0) are not shown.

In the first mode, as shown in FIG. 19, the mode-select transistors 61a, 61b, 61c, and 61d of the mode selector 60B are turned on, and thus the memory cell array 10 and the sense amplifier 50d can be electrically connected to each other. In the selection circuit 70B, as shown in FIG. 20, the transistors 74a, 74b, 74c, and 74d of the mode switching circuit 73B are turned on.

In the selection circuit 70B, when "1" is input from the input port X[5] and "1" is input from the input port X[4], the transistors 78b and 77d are turned on, and thus the enable signal EN is output to the 4-input multiplexer tree 71d through the transistors 78b, 77d, and 74d to activate the 4-input multiplexer tree 71d. The cell-select signal S_$i$ for selecting one memory cell among the memory cells MC_48 to MC_63 is then output from the 4-input multiplexer tree 71d in response to the input of the 4-bit logic signals. The data written in the memory cell MC_$i$ selected by the cell-select signal S_$i$ is read by the sense amplifier 50d through the mode-select transistor 61d. The read voltage $V_{RD}$ of the sense amplifier 50d is defined by the combined resistance of the resistance (high resistance, low resistance) corresponding to the data written in the memory cell MC_$i$ selected by the cell-select signal S_$i$ and the resistance of the mode-select transistor 61d.

When "1" is input from the input port X[5] and "1" is input from the input port XB[4], the transistors 78b and 77c are turned on, and thus the enable signal EN is output to the 4-input multiplexer tree 71c through the transistors 78b, 77c, and 74c to activate the 4-input multiplexer tree 71c. The cell-select signal S_$i$ for selecting one memory cell among the memory cells MC_32 to MC_47 is then output from the 4-input multiplexer tree 71c in response to the input of the 4-bit logic signals. The data written in the memory cell MC_$i$ selected by the cell-select signal S_$i$ is read by the sense amplifier 50d through the mode-select transistor 61c.

The read voltage $V_{RD}$ of the sense amplifier 50d is defined by the combined resistance of the resistance corresponding to the data written in the memory cell MC_i selected by the cell-select signal S_i and the resistance of the mode-select transistor 61c.

When "1" is input from the input port XB[5] and "1" is input from the input port X[4], the transistors 78a and 77b are turned on, and thus the enable signal EN is output to the 4-input multiplexer tree 71b through the transistors 78a, 77b, and 74b to activate the 4-input multiplexer tree 71b. The cell-select signal S_i for selecting one memory cell among the memory cells MC_16 to MC_31 is then output from the 4-input multiplexer tree 71b in response to the input of the 4-bit logic signals. The data written in the memory cell MC_i selected by the cell-select signal S_i is read by the sense amplifier 50d through the mode-select transistor 61b. The read voltage $V_{RD}$ of the sense amplifier 50d is defined by the combined resistance of the resistance (high resistance, low resistance) corresponding to the data written in the memory cell MC_i selected by the cell-select signal S_i and the resistance of the mode-select transistor 61b.

When "1" is input from the input port XB[5] and "1" is input from the input port XB[4], the transistors 78a and 77a are turned on, and thus the enable signal EN is output to the 4-input multiplexer tree 71a through the transistors 78a, 77a, and 74a to activate the 4-input multiplexer tree 71a. The cell-select signal S_i for selecting one memory cell among the memory cells MC_0 to MC_15 is then output from the 4-input multiplexer tree 71a in response to the input of the 4-bit logic signals. The data written in the memory cell MC_i selected by the cell-select signal S_i is read by the sense amplifier 50d through the mode-select transistor 61a. The read voltage $V_{RD}$ of the sense amplifier 50d is defined by the combined resistance of the resistance (high resistance, low resistance) corresponding to the data written in the memory cell MC_i selected by the cell-select signal S_i and the resistance of the mode-select transistor 61a.

As described above, in the first mode, a single cell-select signal S_i is output in response to the input of the 6-bit logic signals to the selection circuit 70B, and the data written in one memory cell MC_i selected by the single cell-select signal S_i is read by the single sense amplifier 50d and output as an operation result of a single logic function. That is, in the first mode, the selection circuit 70B operates as a single 64-to-1 multiplexer, and the lookup table circuit 300 operates as a single 6-input lookup table circuit 300a.

Next, the second mode (SELB=1, SEL=0) will be described.

Figure 21:
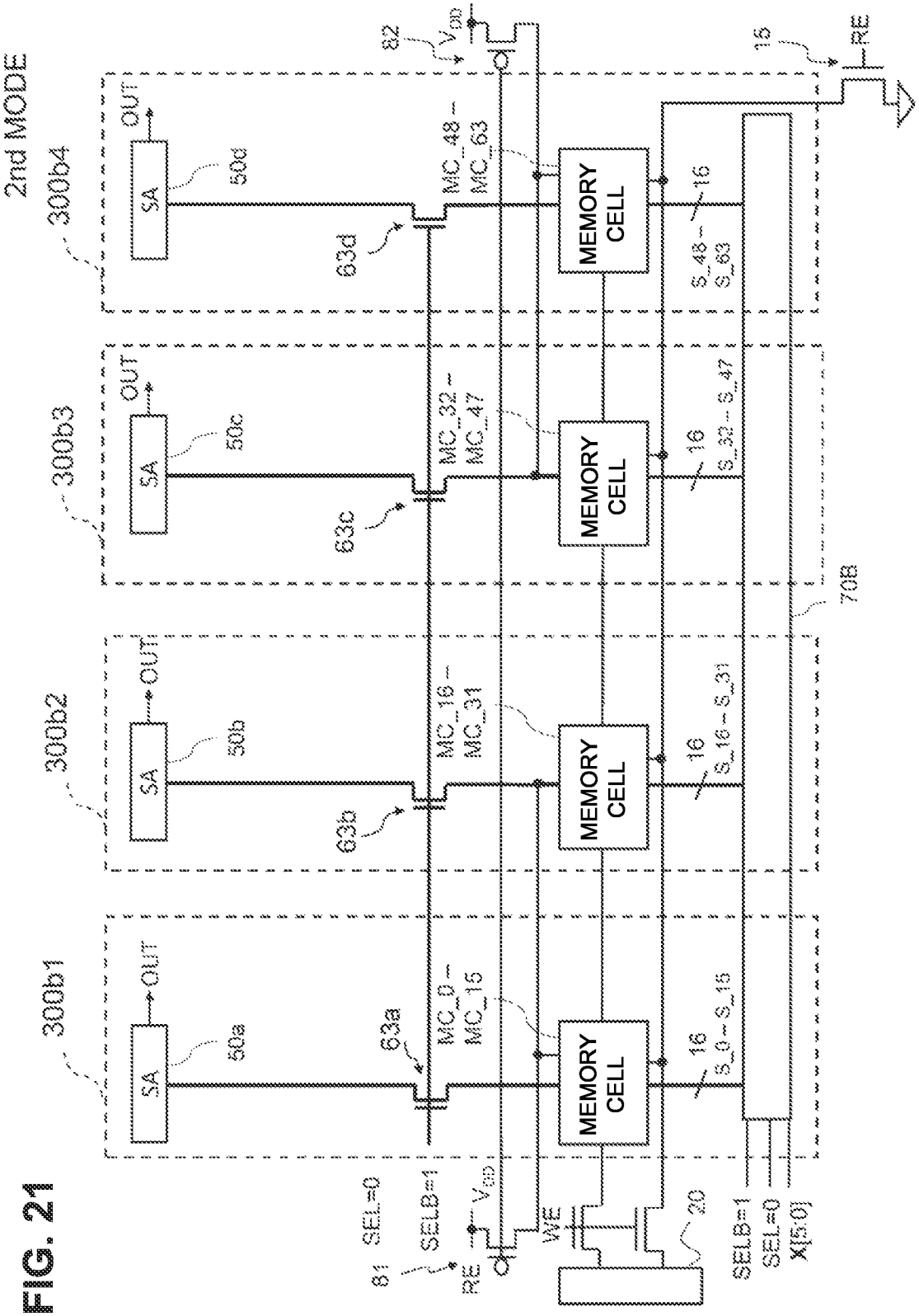
FIG. 21 is a diagram illustrating four 4-input lookup table circuits configured in a second mode (SEL=0) of the third embodiment.
Figure 22:
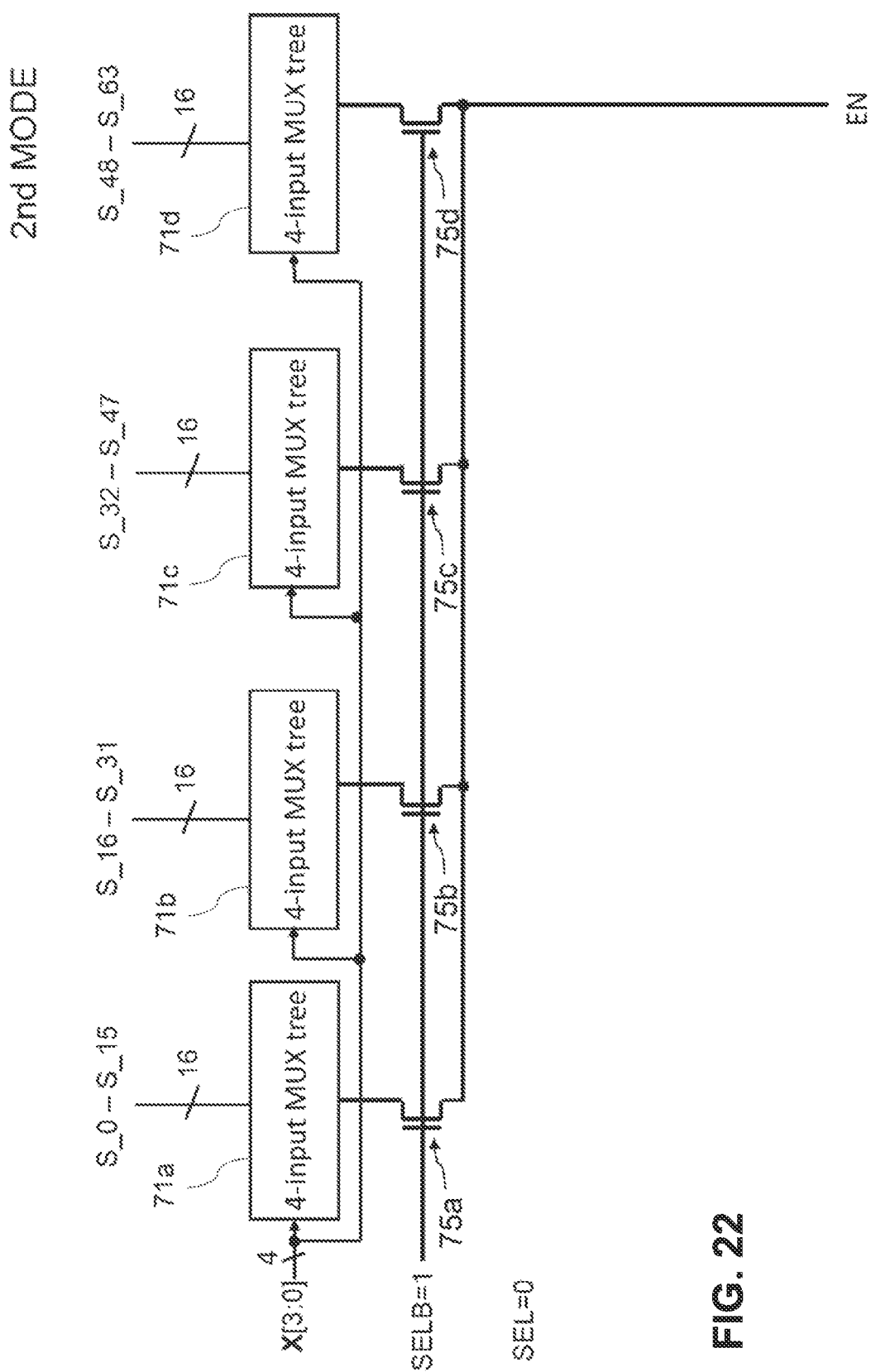
FIG. 22 is a diagram illustrating the selection circuit configured in the second mode of the third embodiment.

FIGS. 21 and 22 show a circuit configured by the lookup table circuit 300 in the second mode. In FIGS. 21 and 22, among the elements of the lookup table circuit 300, only the elements that operate by the H-level control signal (SELB=1) are shown, whereas the elements that do not operate by the L-level control signal (SEL=0) are not shown.

In the second mode, as shown in FIG. 21, the mode-select transistors 63a, 63b, 63c, and 63d of the mode selector 60B are turned on. Thus, the sense amplifier 50a and the memory cells MC_0 to MC_15 can be electrically connected to each other, the sense amplifier 50b and the memory cells MC_16 to MC_31 can be electrically connected to each other, the sense amplifier 50c and the memory cells MC_32 to MC_47 can be electrically connected to each other, and the sense amplifier 50d and the memory cells MC_48 to MC_63 can be electrically connected to each other. In the selection circuit 70B, as shown in FIG. 22, the transistors 75a, 75b, 75c, and 75d of the mode switching circuit 73B are turned on.

The enable signal EN is output to the 4-input multiplexer trees 71a, 71b, 71c, and 71d through the transistors 75a, 75b, 75c, and 75d, respectively, thereby activating all of the 4-input multiplexer trees 71a, 71b, 71c, and 71d.

From the 4-input multiplexer tree 71a, the cell-select signal S_i for selecting one memory cell among the memory cells MC_0 to MC_15 is output in response to the input of the 4-bit logic signals. The data written in the memory cell MC_i selected by the cell-select signal S_i is read by the sense amplifier 50a through the mode-select transistor 63a. The read voltage $V_{RD}$ of the sense amplifier 50a is defined by the combined resistance of the resistance (high resistance, low resistance) corresponding to the data written in the memory cell MC_i selected by the cell-select signal S_i and the resistance of the mode-select transistor 63a.

From the 4-input multiplexer tree 71b, the cell-select signal S_i for selecting one memory cell among the memory cells MC_16 to MC_31 is output in response to the input of the 4-bit logic signals. The data written in the memory cell MC_i selected by the cell-select signal S_i is read by the sense amplifier 50b through the mode-select transistor 63b. The read voltage $V_{RD}$ of the sense amplifier 50b is defined by the combined resistance of the resistance corresponding to the data written in the memory cell MC_i selected by the cell-select signal S_i and the resistance of the mode-select transistor 63b.

From the 4-input multiplexer tree 71c, the cell-select signal S_i for selecting one memory cell among the memory cells MC_32 to MC_47 is output in response to the input of the 4-bit logic signals. The data written in the memory cell MC_i selected by the cell-select signal S_i is read by the sense amplifier 50c through the mode-select transistor 63c. The read voltage $V_{RD}$ of the sense amplifier 50c is defined by the combined resistance of the resistance corresponding to the data written in the memory cell MC_i selected by the cell-select signal S_i and the resistance of the mode-select transistor 63c.

From the 4-input multiplexer tree 71d, the cell-select signal S_i for selecting one memory cell among the memory cells MC_48 to MC_63 is output in response to the input of the 4-bit logic signals. The data written in the memory cell MC_i selected by the cell-select signal S_i is read by the sense amplifier 50d through the mode-select transistor 63d. The read voltage $V_{RD}$ of the sense amplifier 50d is defined by the combined resistance of the resistance corresponding to the data written in the memory cell MC_i selected by the cell-select signal S_i and the resistance of the mode-select transistor 63d.

As described above, in the second mode, four cell-select signals S_i are output in response to the input of the 4-bit logic signals (a part of the 6-bit logic signals) to the selection circuit 70B, and the data written in the four memory cells MC_i selected by the four cell-select signals S_i is read by the sense amplifiers 50a to 50d, respectively, and output as operation results of four logic functions. That is, in the second mode, the selection circuit 70B operates as four 16-to-1 multiplexers, and the lookup table circuit 300 operates as four 4-input lookup table circuits 300b1, 300b2, 300b3, and 300b4.

As described above, the lookup table circuit 300 according to the third embodiment also makes it possible to provide different circuit configurations by switching between the first mode and the second mode.

The invention is not limited to the embodiments described above, and various modifications can be made without departing from the scope of the invention.

For example, although in the second and third embodiments, the number of bits of the logic signal is 6 and the number of memory cells is 64, but it goes without saying that the invention are not limited to these values. That is, assuming that the number of bits of the logic signal is k and the number of memory cells is $2^k$, it is possible to provide a fracturable lookup table circuit that operates as a single k-input lookup table circuit in the first mode and operates as $2^m$ (k–m)-input lookup table circuits (m is a positive integer) in the second mode.

The resistive memory element of the memory cell MC_i is not limited to the MTJ device, and a resistive memory element other than the MTJ device may be employed.

REFERENCE SIGNS LIST

10 Memory cell array
11_0 to 11_n–1 MTJ device
12 Access transistor array
12_0 to 12_n–1 Access transistor (Cell-select transistor)
13_0 to 13_n–1, 14a, 14b Transistor
15 Transistor
20 Write circuit
30, 50A, 50B Read circuit
31 Resistance dividing part
312 Transistor
32 Inverting part
33 Latch part
40, 70A, 70B Selection circuit
41a, 41b, 42a, 42b, 43a, 43b, TR Transistor
50a, 50b, 50c, 50d Sense amplifier (Divided read circuit)
60A, 60B Mode selector
61, 61a, 61b, 61c, 61d, 62, 63, 63a, 63b, 63c, 63d, 64 Mode-select transistor
71, 72 5-input multiplexer tree (Divided selection circuit)
71a, 71b, 71c, 71d 4-input multiplexer tree (Divided selection circuit)
73A, 73B Mode switching circuit
81, 82, 313 Pre-charge transistor (Charging circuit)
100, 200, 300 Lookup table circuit
200a, 300a 6-input lookup table circuit
200b1, 200b2 5-input lookup table circuit
300b1, 300b2, 300b3, 300b4 4-input lookup table circuit
MC_1 to MC_n–1 Memory cell
Path PA
S_1 to S_n–1 Cell-select signal
SEL, SELB Control signal

The invention claimed is:

1. A lookup table circuit constituting a programmable logic device, comprising:
a memory cell array including a plurality of memory cells, each having a resistive memory element;
a selection circuit connected to the memory cell array and configured to output, to the memory cell array, a single cell-select signal or two or more cell-select signals for selecting a single memory cell or two or more memory cells among the plurality of memory cells, based on input of a plurality of logic signals; and
a read circuit connected to the memory cell array and configured to read data from the single memory cell or the two or more memory cells selected by the single cell-select signal or the two or more cell-select signals, among the plurality of memory cells, wherein
the selection circuit is separated from a path along which the read circuit is configured to read data from the memory cell array,
the selection circuit includes:
two or more divided selection circuits configured to output the single cell-select signal or the two or more cell-select signals to the memory cell array in response to input of at least part of the plurality of logic signals; and
a mode switching circuit connected to the two or more divided selection circuits and configured to switch between a first mode and a second mode in response to input of a control signal, the first mode being defined as causing one of the two or more divided selection circuits to output the single cell-select signal to cause the read circuit, the memory cell array, and the selection circuit to operate as a single lookup table circuit, the second mode being defined as causing the two or more divided selection circuits to output the two or more cell-select signals, respectively to cause the read circuit, the memory cell array, and the selection circuit to operate as two or more lookup table circuits.

2. The lookup table circuit according to claim 1, wherein the read circuit includes two or more divided read circuits connected to the memory cell array and configured to read data from the single memory cell or the two or more memory cells selected by the single cell-select signal or the two or more cell-select signals, and
the lookup table circuit further comprises a mode selector connected between the two or more divided read circuits and the memory cell array and configured to switch an electrical connection between the two or more divided read circuits and the memory cell array in response to input of the control signal.

3. The lookup table circuit according to claim 2, wherein the first mode is a mode in which the read circuit, the memory cell array, and the selection circuit operate as the single lookup table circuit into which the plurality of logic signals is configured to be input, and
the second mode is a mode in which the read circuit, the memory cell array, and the selection circuit operate as the two or more lookup table circuits, into each of which part of the plurality of logic signals is configured to be input,
in the first mode:
the selection circuit is configured to output the single cell-select signal to the memory cell array in response to the input of the control signal and the input of the plurality of logic signals;
the mode selector is configured to cause the memory cell array and one of the two or more divided read circuits to be electrically connected to each other in response to the input of the control signal; and
the one of the two or more divided read circuits is configured to read data from the single memory cell selected by the single cell-select signal among the plurality of memory cells, and
in the second mode:
the selection circuit is configured to output the two or more cell-select signals to the memory cell array in response to the input of the control signal and the input of the part of the plurality of logic signals;
the mode selector is configured to cause the memory cell array and the two or more divided read circuits to be electrically connected to each other in response to the input of the control signal; and
the two or more divided read circuits are configured to read data from the two or more memory cells, respectively, selected by the two or more cell-select signals among the plurality of memory cells.

4. The lookup table circuit according to claim 2, wherein
the mode selector includes a mode-select transistor configured to be turned on and off in response to the input of the control signal to switch the electrical connection between the two or more divided read circuits and the memory cell array, and each of the two or more divided read circuits is configured to read a voltage that is defined based on a combined resistance of the mode-select transistor and the single memory cell or each of the two or more memory cells selected by the single cell-select signal or the two or more cell-select signals.

5. The lookup table circuit according to claim 4, wherein
each of the plurality of memory cells further includes a cell-select transistor connected to the selection circuit and configured to select the resistive memory element as an access target, based on the single cell-select signal or each of the two or more cell-select signals output from the selection circuit, and a gate width of the mode-select transistor is longer than a gate width of the cell-select transistor.

6. The lookup table circuit according to claim 4, wherein
each of the plurality of memory cells further includes a cell-select transistor connected to the selection circuit and configured to select the resistive memory element as an access target, based on the single cell-select signal or each of the two or more cell-select signals output from the selection circuit, and on resistance of the mode-select transistor is smaller than on resistance of the cell-select transistor.

7. The lookup table circuit according to claim 2, wherein each of the two or more divided read circuits includes a single-ended sense amplifier.

8. The lookup table circuit according to claim 1, wherein the read circuit includes a single-ended sense amplifier.

9. The lookup table circuit according to claim 1, further comprising a charging circuit connected to the memory cell array and configured to charge the plurality of memory cells during a read operation by the read circuit is not performed.

10. The lookup table circuit according to claim 1, wherein the resistive memory element is defined as a magnetic tunnel junction device.

* * * * *